(12) United States Patent
Lau et al.

(10) Patent No.: US 11,832,458 B2
(45) Date of Patent: Nov. 28, 2023

(54) TUNABLE DOPING OF CARBON NANOTUBES THROUGH ENGINEERED ATOMIC LAYER DEPOSITION

(71) Applicant: Massachusetts Institute of Technology, Cambridge, MA (US)

(72) Inventors: Christian Lau, Boston, MA (US); Max Shulaker, Weston, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 257 days.

(21) Appl. No.: 17/211,329

(22) Filed: Mar. 24, 2021

(65) Prior Publication Data

US 2021/0313530 A1 Oct. 7, 2021

Related U.S. Application Data

(63) Continuation of application No. PCT/US2019/052675, filed on Sep. 24, 2019.

(Continued)

(51) Int. Cl.
| | |
|---|---|
| H01L 23/00 | (2006.01) |
| H10K 10/88 | (2023.01) |
| H10K 10/84 | (2023.01) |
| H10K 10/46 | (2023.01) |
| H10K 19/10 | (2023.01) |

(Continued)

(52) U.S. Cl.
CPC ........... *H10K 10/88* (2023.02); *H10K 10/462* (2023.02); *H10K 10/84* (2023.02); *H10K 19/10* (2023.02); *H10K 85/221* (2023.02); *H10K 2102/00* (2023.02)

(58) Field of Classification Search
CPC ........................ H10K 10/462; H10K 85/221
See application file for complete search history.

(56) References Cited

U.S. PATENT DOCUMENTS

| | | |
|---|---|---|
| 6,191,724 B1 | 2/2001 | McEwan |
| 6,462,929 B2 | 10/2002 | Compton et al. |

(Continued)

FOREIGN PATENT DOCUMENTS

| | | |
|---|---|---|
| CN | 101341488 A | 1/2009 |
| CN | 102095769 A | 6/2011 |

(Continued)

OTHER PUBLICATIONS

International Search Report and Written Opinion in International Patent Application No. PCT/US19/15595 dated Apr. 19, 2019, 14 pages.

(Continued)

*Primary Examiner* — Anthony Ho
(74) *Attorney, Agent, or Firm* — Smith Baluch LLP

(57) ABSTRACT

A carbon nanotube field effect transistor (CNFET), that has a channel formed of carbon nanotubes (CNTs), includes a layered deposit of a nonstoichiometric doping oxide (NDO), such as $HfO_x$, where the concentration of the NDO varies through the thickness of the layer(s). An n-type metal-oxide semiconductor (NMOS) CNFET made in this manner can achieve similar ON-current, OFF-current, and/or threshold voltage magnitudes to a corresponding p-type metal-oxide semiconductor (PMOS) CNFET. Such an NMOS and PMOS can be used to achieve a symmetric complementary metal-oxide semiconductor (CMOS) CNFET design.

19 Claims, 16 Drawing Sheets

Related U.S. Application Data

(60) Provisional application No. 62/735,773, filed on Sep. 24, 2018.

(51) Int. Cl.
*H10K 85/20* (2023.01)
*H10K 102/00* (2023.01)

(56) References Cited

U.S. PATENT DOCUMENTS

| | | |
|---|---|---|
| 7,598,544 B2 | 10/2009 | Bertin et al. |
| 7,859,385 B2 | 12/2010 | Bertin et al. |
| 8,288,236 B2 | 10/2012 | Chang et al. |
| 8,557,659 B2 | 10/2013 | Teo et al. |
| 8,664,091 B2 | 3/2014 | Zhu et al. |
| 8,685,815 B2 | 4/2014 | Ahn et al. |
| 8,772,141 B2 | 7/2014 | Afzali-Ardakani et al. |
| 8,785,911 B2 | 7/2014 | Chen et al. |
| 8,946,007 B2 | 2/2015 | Doris et al. |
| 9,209,288 B2 | 12/2015 | Avci et al. |
| 9,613,879 B2 | 4/2017 | Hersam et al. |
| 10,256,320 B1 | 4/2019 | Liu et al. |
| 11,062,067 B2 | 7/2021 | Hills et al. |
| 11,271,160 B2 | 3/2022 | Lau et al. |
| 11,561,195 B2 | 1/2023 | Shulaker et al. |
| 2004/0099438 A1 | 5/2004 | Arthur et al. |
| 2005/0181587 A1 | 8/2005 | Duan et al. |
| 2005/0245836 A1 | 11/2005 | Star et al. |
| 2006/0115640 A1 | 6/2006 | Yodh et al. |
| 2006/0183278 A1 | 8/2006 | Bertin et al. |
| 2006/0204427 A1 | 9/2006 | Ghenciu et al. |
| 2007/0281409 A1 | 12/2007 | Zhang et al. |
| 2008/0099842 A1 | 5/2008 | Gyoujin et al. |
| 2008/0210987 A1 | 9/2008 | Bondavalli et al. |
| 2009/0184346 A1 | 7/2009 | Jain |
| 2010/0111813 A1 | 5/2010 | Fan |
| 2010/0207208 A1 | 8/2010 | Bedell et al. |
| 2011/0045660 A1 | 2/2011 | Romano et al. |
| 2011/0147715 A1 | 6/2011 | Rogers et al. |
| 2011/0201956 A1 | 8/2011 | Alferness et al. |
| 2012/0089041 A1 | 4/2012 | Schlager |
| 2012/0129273 A1 | 5/2012 | Johnson, Jr. et al. |
| 2012/0129301 A1 | 5/2012 | Or-Bach et al. |
| 2012/0326126 A1 | 12/2012 | Chen et al. |
| 2013/0122690 A1 | 5/2013 | Zhu et al. |
| 2013/0134394 A1 | 5/2013 | Zhou et al. |
| 2014/0008606 A1 | 1/2014 | Hussain et al. |
| 2014/0017886 A1 | 1/2014 | Teo et al. |
| 2014/0175376 A1 | 6/2014 | Avci et al. |
| 2015/0227669 A1 | 8/2015 | Joshi et al. |
| 2015/0318504 A1 | 11/2015 | Xiao |
| 2015/0370948 A1 | 12/2015 | Kawa et al. |
| 2016/0077047 A1 | 3/2016 | Khamis et al. |
| 2016/0123919 A1 | 5/2016 | Johnson et al. |
| 2016/0133843 A1 | 5/2016 | Rogers et al. |
| 2016/0147934 A1 | 5/2016 | Keller et al. |
| 2016/0190492 A1 | 6/2016 | Li et al. |
| 2017/0005140 A1 | 1/2017 | Bertin |
| 2017/0059514 A1 | 3/2017 | Hoffman |
| 2017/0162710 A1 | 6/2017 | Shih et al. |
| 2017/0179283 A1 | 6/2017 | Pourghaderi et al. |
| 2017/0294583 A1 | 10/2017 | Liang et al. |
| 2019/0167152 A1 | 6/2019 | Weda et al. |
| 2019/0189775 A1 | 6/2019 | Liu et al. |
| 2019/0341450 A1 | 11/2019 | Lee et al. |
| 2019/0378998 A1 | 12/2019 | Sakii et al. |
| 2020/0082032 A1 | 3/2020 | Hills et al. |
| 2021/0050417 A1 | 2/2021 | Shulaker et al. |
| 2021/0247356 A1 | 8/2021 | Shulaker et al. |
| 2021/0294959 A1 | 9/2021 | Hills et al. |
| 2021/0313530 A1 | 10/2021 | Lau et al. |
| 2021/0351354 A1 | 11/2021 | Lau et al. |
| 2022/0284077 A1 | 9/2022 | Dahl et al. |

FOREIGN PATENT DOCUMENTS

| | | | |
|---|---|---|---|
| CN | 104778324 | A | 7/2015 |
| CN | 106233464 | A | 12/2016 |
| EP | 0190070 | B1 | 8/1992 |
| WO | 2014113722 | A1 | 7/2014 |
| WO | 2017001406 | A3 | 4/2017 |

OTHER PUBLICATIONS

International Search Report and Written Opinion in International Patent Application No. PCT/US2019/036006 dated Oct. 16, 2019, 13 pages.

International Search Report and Written Opinion in International Patent Application No. PCT/US2019/052675 dated Jan. 14, 2020, 16 pages.

International Search Report and Written Opinion in International Patent Application No. PCT/US2019/063932 dated Feb. 19, 2020, 14 pages.

Javey et al., "Ballistic carbon nanotube field-effect transistors." nature 424.6949 (2003): 654-657.

Joo et al., Dose-Controlled, Floating Evaporative Self-Assembly and Alignment of Semiconducting Carbon Nanotubes from Organic Solvents. Langmuir 2014, 30, 3460-3466.

Kalil et al., "Executive summary: management of adults with hospital-acquired and ventilator-associated pneumonia: 2016 clinical practice guidelines by the Infectious Diseases Society of America and the American Thoracic Society." Clinical Infectious Diseases 63.5 (2016): 575-582.

Kalil et al., "Management of adults with hospital-acquired and ventilator-associated pneumonia: 2016 clinical practice guidelines by the Infectious Diseases Society of America and the American Thoracic Society." Clinical Infectious Diseases 63.5 (2016): e61-e111.

Kang et al., CMOS digital integrated circuits. Tata McGraw Hill Education, 2003. 83 pages.

Khan et al., "Science and research policy at the end of Moore's law." Nature Electronics 1.1 (2018): 14-21.

Kim et al., "Atomic layer deposited Al 2 O 3 for gate dielectric and passivation layer of single-walled carbon nanotube transistors." Applied physics letters 90.16 (2007): 163108. 4 pages.

Koenig et al., "Ventilator-associated pneumonia: diagnosis, treatment, and prevention." Clinical microbiology reviews 19.4 (2006): 637-657.

Kollef et al., "Economic impact of ventilator-associated pneumonia in a large matched cohort." (2012). 9 pages.

Kuhn et al., The Ultimate CMOS Device and Beyond. In IEEE Int. Electron Devices Meet.; 2012; vol. 8.1.1?8.1. 4 pages.

Kuhn,. "Considerations for ultimate CMOS scaling." IEEE transactions on Electron Devices 59.7 (2012): 1813-1828.

Kuti et al., "Impact of inappropriate antibiotic therapy on mortality in patients with ventilator-associated pneumonia and blood stream infection: a meta-analysis." Journal of critical care 23.1 (2008): 91-100.

La Tulipe et al., "Upside-down FETS." SOI Conference, 2008. SOI. IEEE International. IEEE, 2008. 2 pages.

Lau et al., "Tunable n-type doping of carbon nanotubes through engineered atomic layer deposition HfOX films." ACS nano 12.11 (2018): 10924-10931.

Lee et al., "A compact virtual-source model for carbon nanotube FETs in the sub-10-nm regime Part I: Intrinsic elements." IEEE transactions on electron devices 62.9 (2015): 3061-3069.

Li et al., "Facile method for enhancing conductivity of printed carbon nanotubes electrode via simple rinsing process." Organic Electronics 47 (2017): 174-180.

Library Design. Silvaco, Inc. Accessed at https://silvaco.com/services/library-design/ on Mar. 2, 2021. 4 pages.

Liebmann et al., "Overcoming scaling barriers through design technology cooptimization." VLSI Technology, 2016 IEEE Symposium on. IEEE, 2016. 2 pages.

(56) References Cited

OTHER PUBLICATIONS

Lin et al., "ACCNT—A metallic-CNT-tolerant design methodology for carbon-nanotube VLSI: Concepts and experimental demonstration." IEEE Transactions on Electron Devices 56.12 (2009): 2969-2978.

Liu et al., Carbon Nanotube-Based Three-Dimensional Monolithic Optoelectronic Integrated System. Nat. Commun. 2017, 8, 15649. 8 pages.

Machado et al., "Cost-effectiveness of linezolid versus vancomycin in mechanical ventilation-associated nosocomial pneumonia caused by methicillin-resistant *Staphylococcus aureus*." Brazilian Journal of Infectious Diseases 9.3 (2005): 191-200.

Markov et al., "Progress and challenges in VLSI placement research." Proceedings of the IEEE 103.11 (2015): 1985-2003.

McClellan et al., Effective N-Type Doping of Monolayer MoS2 by AlOx. In 2017 75th Annual Device Research Conference (DRC); IEEE, 2017; 1-2.

Melsen et al., "Attributable mortality of ventilator-associated pneumonia: a meta-analysis of individual patient data from randomised prevention studies." The Lancet infectious diseases 13.8 (2013): 665-671.

Mistry, 10 nm Technology Leadership. Leading at the edge technology and manufacturing day 2017. Intel. Accessed at https://newsroom.intel.com/newsroom/wp-content/uploads/sites/Nov/2017/03/Kaizad-Mistry-2017-Manufacturing.pdf. 37 pages.

Muscedere et al., "Mortality, attributable mortality, and clinical events as end points for clinical trials of ventilator-associated pneumonia and hospital-acquired pneumonia." Clinical infectious diseases 51.Supplement_1 (2010): S120-S125.

Nakhleh et al., "Diagnosis and classification of 17 diseases from 1404 subjects via pattern analysis of exhaled molecules." ACS nano 11.1 (2017): 112-125.

Narasimha et al., "A 7nm CMOS technology platform for mobile and high performance compute application." Electron Devices Meeting (IEDM), 2017 IEEE International. IEEE, 2017. 4 pages.

Niemetz, et al., Boolector 2.0. Journal on Satisfiability, Boolean Modeling and Computation 9 (2015) 53-58.

Nourbakhsh et al., "MoS2 field-effect transistor with sub-10 nm channel length." Nano letters 16.12 (2016): 7798-7806.

Nvidia RISC-V Story. Nvidia 4th RISC-V Workshop Jul. 2016. Accessed at https://riscv.org/wp-content/uploads/2016/07/Tue1100_Nvidia_RISCV_Story_V2.pdf. 15 pages.

Open Source RISC-V Cores and Tools. Bluespec. Accessed at https://bluespec.com/ on Feb. 13, 2020. 5 pages.

OpenSPARC Overview. Oracle Accessed at http://www.opensparc.net/opensparc-t2 on Feb. 13, 2020. 1 pages.

Patil et al., "VMR: VLSI-compatible metallic carbon nanotube removal for imperfection-immune cascaded multi-stage digital logic circuits using carbon nanotube FETs." 2009 IEEE International Electron Devices Meeting (IEDM). IEEE, 2009. 4 pages.

Patil et al., "Wafer-scale growth and transfer of aligned single-walled carbon nanotubes." IEEE Transactions on Nanotechnology 8.4 (2009): 498-504.

Patterson, "50 Years of computer architecture: From the mainframe CPU to the domain-specific tpu and the open RISC-V instruction set." 2018 IEEE International Solid-State Circuits Conference—(ISSCC). IEEE, 2018. 5 pages.

Phillips et al., "Variation in volatile organic compounds in the breath of normal humans." Journal of Chromatography B: Biomedical Sciences and Applications 729.1-2 (1999): 75-88.

Prakash et al., Understanding Contact Gating in Schottky Barrier Transistors from 2D Channels. Sci. Rep. 2017, 7, 12596. 9 pages.

PrimeTime Static Timing Analysis. Synopsys, Inc. Accessed at https://www.synopsys.com/implementation-and-signoff/signoff/primetime.html on Mar. 2, 2021. 7 pages.

Qiu et al., "Scaling carbon nanotube complementary transistors to 5-nm gate lengths." Science355.6322 (2017): 271-276.

Rai et al., Air Stable Doping and Intrinsic Mobility Enhancement in Monolayer Molybdenum Disulfide by Amorphous Titanium Suboxide Encapsulation. Nano Lett. 2015, 15, 4329-4336.

Rai et al., Interfacial-Oxygen-Vacancy Mediated Doping of MoS2 by high-k dielectrics. In 2015 73rd Annual Device Research Conference (DRC); IEEE, 2015; 189-190.

Rana et al., "A review on recent advances of CNTs as gas sensors." Sensor Review (2017). 12 pages.

Sabry et al., Energy-Efficient Abundant-Data Computing: The N3XT 1,000x. Computer (Long. Beach. Calif). 2015, 48, 24-33.

Safdar et al., "The pathogenesis of ventilator-associated pneumonia: its relevance to developing effective strategies for prevention." Respiratory care 50.6 (2005): 725-741.

Schnabel et al., "Electronic nose analysis of exhaled breath to diagnose ventilator-associated pneumonia." Respiratory medicine 109.11 (2015): 1454-1459.

Semiconductor Industry Association. "International Technology Roadmap for Semiconductors (2013)." Downloaded from http://www.itrs2.net/itrs-reports.html on Feb. 24, 2020. 237 pages.

Sentaurus Device. Synopsys, Inc . . . Accessed at https://www.synopsys.com/silicon/tcad/device-simulation/sentaurus-device.html on Mar. 2, 2021. 3 pages.

Seo et al., "A 10nm platform technology for low power and high performance application featuring FINFET devices with multi workfunction gate stack on bulk and SOI." VLSI Technology (VLSI-Technology): Digest of Technical Papers, 2014 Symposium on. IEEE, 2014. 2 pages.

Shahrjerdi et al., "High-performance air-stable n-type carbon nanotube transistors with erbium contacts." ACS nano 7.9 (2013): 8303-8308.

Sherazi et al., "Track height reduction for standard-cell in below 5nm node: how low can you go ?. " Design-Process-Technology Co-optimization for Manufacturability XII. vol. 10588. International Society for Optics and Photonics, 2018. 14 pages.

Shulaker et al., "Carbon nanotube circuit integration up to sub-20 nm channel lengths." ACS nano 8.4 (2014): 3434-3443.

Shulaker et al., "Carbon nanotube computer." Nature 501.7468 (2013): 526-530.

Shulaker et al., "Efficient metallic carbon nanotube removal for highly-scaled technologies." 2015 IEEE International lectron Devices Meeting (IEDM). IEEE, 2015. 4 pages.

Shulaker et al., "Experimental demonstration of a fully digital capacitive sensor interface built entirely using carbon-nanotube FETs." 2013 IEEE International Solid-State Circuits Conference Digest of Technical Papers. IEEE, 2013. 3 pages.

Shulaker et al., "Linear increases in carbon nanotube density through multiple transfer technique." Nano letters 11.5 (2011): 1881-1886.

Shulaker et al., "Monolithic 3D integration of logic and memory: Carbon nanotube FETs, resistive RAM, and silicon FETs." 2014 IEEE International Electron Devices Meeting. IEEE, 2014. 4 pages.

Shulaker et al., "Monolithic three-dimensional integration of carbon nanotube FETs with silicon CMOS." 2014 Symposium on VLSI Technology (VLSI-Technology): Digest of Technical Papers. IEEE, 2014. 2 pages.

Shulaker et al., "Sensor-to-digital interface built entirely with carbon nanotube FETs." IEEE Journal of Solid-State Circuits 49.1 (2013): 190-201.

Shulaker et al., "Three-dimensional integration of nanotechnologies for computing and data storage on a single chip." Nature 547.7661 (2017): 74. 19 pages.

Shulaker et al., Carbon nanotube computer. Nature. Sep. 26, 2013;501(7468):526-30.

Shulaker et al., High-Performance Carbon Nanotube Field-Effect Transistors. In 2014 IEEE International Electron Devices Meeting; IEEE, 2014; 33.6.1-33.6.4.

Si et al., "Scalable preparation of high-density semiconducting carbon nanotube arrays for high-performance field-effect transistors." ACS nano 12.1 (2018): 627-634.

Spectre Simulation Platform. Cadence Design Systems, Inc. Accessed at https://www.cadence.com/en_US/home/tools/custom-ic-analog-rf-design/circuit-simulation/spectre-simulation-platform.html on Mar. 2, 2021. 3 pages.

Spike, a RISC-V ISA Simulator. Github. Accessed at https://github.com/riscv/riscv-isa-sim on Feb. 13, 2020. 6 pages.

(56) References Cited

OTHER PUBLICATIONS

Suriyasena Liyanage et al., VLSI-Compatible Carbon Nanotube Doping Technique with Low Work-Function Metal Oxides. Nano Lett. 2014, 14, 1884-1890.
Tang et al., "Flexible CMOS integrated circuits based on carbon nanotubes with sub-10 ns stage delays." Nature Electronics 1.3 (2018): 191-196.
Tans et al., "Room-temperature transistor based on a single carbon nanotube." Nature 393.6680 (1998): 49-52.
TCAD—Raphael. Synopsys, Inc. Accessed at https://www.synopsys.com/silicon/tcad/interconnect-simulation/raphael.html on Mar. 2, 2021. 4 pages.
Tracer—Electron scattering and process effects quantified. GenISys GmbH 2017. Accessed at https://www.genisys-gmbh.com/tracer.html on Mar. 2, 2021. 6 pages.
TruNarc. HazmatLINK. Accessed at http://www.hazmatlink.com/trunarc.html on Mar. 2, 2021. 2 pages.
Tulevski et al., "High purity isolation and quantification of semiconducting carbon nanotubes via column chromatography." ACS nano 7.4 (2013): 2971-2976.
Tulevski et al., "Toward high-performance digital logic technology with carbon nanotubes." ACS nano 8.9 (2014): 3730-8745.
Understand, Predict, and Optimize Physics-Based Designs and Processes with Comsol Multiphysics@. Comsol Multiphysics@. Accessed at https://www.comsol.com/comsol-multiphysics on Mar. 2, 2021. 16 pages.
Valsaraj et al., Theoretical and Experimental Investigation of Vacancy-Based Doping of Monolayer MoS 2 on Oxide. 2D Mater. 2015, 2, 045009. 12 pages.
Venkatachalam et al., "The diagnostic dilemma of ventilator-associated pneumonia in critically ill children." Pediatric Critical Care Medicine 12.3 (2011): 286-296.
Vinet et al., "3D monolithic integration: Technological challenges and electrical results." Microelectronic Engineering88.4 (2011): 331-335.
Wang et al., "Growing highly pure semiconducting carbon nanotubes by electrotwisting the helicity." Nature Catalysis 1.5 (2018): 326-331.
Wang et al., "National trends in patient safety for four common conditions, 2005-2011." N Engl J Med 370 (2014): 341-351.
Wei et al. "A non-iterative compact model for carbon nanotube FETs incorporating source exhaustion effects." 2009 IEEE International Electron Devices Meeting (IEDM). IEEE, 2009. 4 pages.
Western Digital To Accelerate The Future Of Next-Generation Computing Architectures For Big Data And Fast Data Environments. Western Digital Nov. 28, 2017. Accessed at https://www.westerndigital.com/company/newsroom/press-releases/2017/2017-11-28-western-digital-to-accelerate-the-future-of-next-generation-computing-architectures-for-big-data-and-fast-data-environments. 7 pages.
Wolf, RISC-V Formal Verification Framework. Github. Accessed at https://github.com/cliffordwolf/riscv-formal. 2 pages.
Wolf, SymbiYosys (sby)—Front-end for Yosys-based formal verification flows. Github. Accessed at https://github.com/YosysHQ/SymbiYosys on Feb. 13, 2020. 1 pages.
Won et al., "Zipping, entanglement, and the elastic modulus of aligned single-walled carbon nanotube films." Proceedings of the National Academy of Sciences 110.51 (2013): 20426-20430.
Wong et al., "Memory leads the way to better computing." Nature nanotechnology 10.3 (2015): 191-194.
Wu et al., "Brain-inspired computing exploiting carbon nanotube FETs and resistive RAM: Hyperdimensional computing case study." 2018 IEEE International Solid-State Circuits Conference—(ISSCC). IEEE, 2018, pp. 492-494.
Wu et al., "Hyperdimensional computing exploiting carbon nanotube FETs, resistive RAM, and their monolithic 3D Integration." IEEE Journal of Solid-State Circuits 53.11 (2018): 3183-3196.
Xu et al., "Efficient and reversible electron doping of semiconductor-enriched single-walled carbon nanotubes by using decamethylcobaltocene." Scientific reports 7.1 (2017): 1-10.

Yakimets et al., "Power aware FinFET and lateral nanosheet FET targeting for 3nm CMOS technology." Electron Devices Meeting (IEDM), 2017 IEEE International. IEEE, 2017. 4 pages.
Yang et al., "High-performance complementary transistors and medium-scale integrated circuits based on carbon nanotube thin films." ACS nano 11.4 (2017): 4124-4132.
Yoshida et al., "Highly conductive metal gate fill integration solution for extremely scaled RMG stack for 5 nm & beyond." Electron Devices Meeting (IEDM), 2017 IEEE International. IEEE, 2017. 4 pages.
Zhang et al., "Air-stable conversion of separated carbon nanotube thin-film transistors from p-type to n-type using atomic layer deposition of high-k oxide and its application in CMOS logic circuits." ACS Nano 5.4 (2011): 3284-3292.
Zhang et al., "Carbon nanotube correlation: promising opportunity for CNFET circuit yield enhancement." Proceedings of the 47th Design Automation Conference. 2010. 4 pages.
Zhang et al., "Doping-free fabrication of carbon nanotube based ballistic CMOS devices and circuits." Nano Letters 7.12 (2007): 3603-3607.
Chinese Notification of Allowance and Search Report with English Translation in Chinese Application No. 201980058941.1 dated Jun. 1, 2022, 6 pages.
Wei et al. Carbon nanotube circuits: Opportunities and challenges. EDAA (2013)IEEE, 2013. 6 pages.
A formal semantics of the RISC-V ISA in Haskell. Github. Accessed at https://github.com/mit-plv/riscv-semantics on Feb. 13, 2020. 3 pages.
Aly et al., "Energy-efficient abundant-data computing: The N3XT 1,000 x." Computer 48.12 (2015): 24-33.
Aly et al., "The N3XT approach to energy-efficient abundant-data computing." Proceedings of the IEEE 107.1 (2018): 19-48.
Appenzeller, Carbon Nanotubes for High-Performance Electronics—Progress and Prospect. Proc. IEEE 2008, 96, 201-211.
Aria et al., Parameter Space of Atomic Layer Deposition of Ultrathin Oxides on Graphene. ACS Appl. Mater. Interfaces 2016, 8, 30564-30575.
Asanovic et al., The berkeley out-of-order machine (boom): An industry-competitive, synthesizable, parameterized risc-v processor. No. UCB-EECS-2015-167. University of California at Berkeley Berkeley United States, 2015. 5 pages.
Bardon et al., "Extreme scaling enabled by 5 tracks cells: Holistic design-device co-optimization for FinFETs and lateral nanowires." Electron Devices Meeting (IEDM), 2016 IEEE International. IEEE, 2016.
Batude et al., "Advances, challenges and opportunities in 3D CMOS sequential integration." 2011 International Electron Devices Meeting. IEEE, 2011. 4 pages.
Boots et al., "Identification of microorganisms based on headspace analysis of volatile organic compounds by gas chromatography-mass spectrometry." Journal of breath research 8.2 (2014): 027106. 13 pages.
Bos et al., "The volatile metabolic fingerprint of ventilator-associated pneumonia." Intensive care medicine 40.5 (2014): 761-762.
Bos et al., "Volatile metabolites of pathogens: a systematic review." PLOS pathog 9.5 (2013): e1003311. 8 pages.
Brady et al., "Polyfluorene-sorted, carbon nanotube array field-effect transistors with increased current density and high on/off ratio." ACS nano 8.11 (2014): 11614-11621.
Brady et al., "Quasi-ballistic carbon nanotube array transistors with current density exceeding Si and GaAs." Science advances 2.9 (2016): e1601240. 10 pages.
Cao et al., "Arrays of single-walled carbon nanotubes with full surface coverage for high-performance electronics." Nature nanotechnology 8.3 (2013): 180. 7 pages.
Cao et al., "Carbon nanotube transistors scaled to a 40-nanometer footprint." Science 356.6345 (2017): 1369-1372.
Cao et al., "End-bonded contacts for carbon nanotube transistors with low, size-independent resistance." Science350.6256 (2015): 68-72.

(56) References Cited

OTHER PUBLICATIONS

Cao et al., "Medium-scale carbon nanotube thin-film integrated circuits on flexible plastic substrates." Nature 454.7203 (2008): 495-500.
Chen et al., "Externally assembled gate-all-around carbon nanotube field-effect transistor." IEEE electron device letters 29.2 (2008): 183-185.
Chen et al., The Role of Metal-Nanotube Contact in the Performance of Carbon Nanotube Field-Effect Transistors. Nano Lett. 2005, 5, 1497-1502.
Clark et al., "ASAP7: A 7-nm finFET predictive process design kit." Microelectronics Journal 53 (2016): 105-115.
Cook, "Ventilator associated pneumonia: perspectives on the burden of illness." Intensive care medicine 26.1 (2000): 3031-S037.
Deng et al., "Carbon nanotube transistor circuits: Circuit-level performance benchmarking and design options for living with imperfections." Solid-State Circuits Conference, 2007. ISSCC 2007. Digest of Technical Papers. IEEE International. IEEE, 2007. 3 pages.
Desai et al., "MoS2 transistors with 1-nanometer gate lengths." Science 354.6308 (2016): 99-102.
Design Compiler Graphical. Synopsys, Inc. Accessed at https://www.synopsys.com/implementation-and-signoff/rtl-synthesis-test/design-compiler-graphical.html on Mar. 2, 2021. 6 pages.
Ding et al., "CMOS-based carbon nanotube pass-transistor logic integrated circuits." Nature communications 3.1 (2012): 1-7.
Ding et al., "Y-contacted high-performance n-type single-walled carbon nanotube field-effect transistors: scaling and comparison with Sc-contacted devices." Nano letters 9.12 (2009): 4209-4214.
Farmer et al., "Atomic layer deposition on suspended single-walled carbon nanotubes via gas-phase noncovalent functionalization." Nano letters 6.4 (2006): 699-703.
Filipiak et al., "Molecular analysis of volatile metabolites released specifically by *Staphylococcus aureus* and Pseudomonas aeruginosa." BMC microbiology 12.1 (2012): 1-16.
Fowler et al., "Critical care capacity in Canada: results of a national cross-sectional study." Critical care 19.1 (2015): 1-8.
Fowler et al., "Surveillance for lower airway pathogens in mechanically ventilated patients by metabolomic analysis of exhaled breath: a case-control study." Thorax 70.4 (2015): 320-325.
Franklin et al., "Carbon nanotube complementary wrap-gate transistors." Nano letters 13.6 (2013): 2490-2495.
Franklin et al., "Scalable and fully self-aligned n-type carbon nanotube transistors with gate-all-around." Electron Devices Meeting (IEDM), 2012 IEEE International. IEEE, 2012. 4 pages.
Franklin et al., "Sub-10 nm carbon nanotube transistor." Nano letters 12.2 (2012): 758-762.
Geier et al., "Controlled n-type doping of carbon nanotube transistors by an organorhodium dimer." Nano letters 16.7 (2016): 4329-4334.
Geier et al., "Solution-processed carbon nanotube thin-film complementary static random access memory." Nature nanotechnology 10.11 (2015): 944. 6 pages.
Geier et al., Subnanowatt Carbon Nanotube Complementary Logic Enabled by Threshold Voltage Control. Nano Lett. 2013, 13, 4810-4814.
Gouma et al., "Novel isoprene sensor for a flu virus breath monitor." Sensors 17.1 (2017): 199. 7 pages.
Ha et al., Highly Uniform and Stable N-Type Carbon Nanotube Transistors by Using Positively Charged Silicon Nitride Thin Films. Nano Lett. 2015, 15, 392-397.
Hahn et al., "A scaled replacement metal gate InGaAs-on-Insulator n-FinFET on Si with record performance." Electron Devices Meeting (IEDM), 2017 IEEE International. IEEE, 2017. 4 pages.
Han et al., "High-speed logic integrated circuits with solution-processed self-assembled carbon nanotubes." Nature nanotechnology 12.9 (2017): 861. 7 pages.
Heinze et al., Carbon Nanotubes as Schottky Barrier Transistors. Phys. Rev. Lett. 2002, 89, 106801. 4 pages.
High Purity, Electronically Separated Nanomaterials. NanoIntegris. Accessed at http://nanointegris.com/ on Feb. 13, 2020. 8 pages.
Hills et al., "Rapid Co-Optimization of Processing and Circuit Design to Overcome Carbon Nanotube Variations." IEEE Trans. on CAD of Integrated Circuits and Systems 34.7 (2015): 1082-1095.
Hills et al., "TRIG: hardware accelerator for inference-based applications and experimental demonstration using carbon nanotube FETs." Proceedings of the 55th Annual Design Automation Conference. 2018. 10 pages.
Hills et al., "Understanding energy efficiency benefits of carbon nanotube field-effect transistors for digital VLSI." IEEE Transactions on Nanotechnology 17.6 (2018): 1259-1269.
Hills et al., Modern microprocessor built from complementary carbon nanotube transistors. Nature 572.7771 (2019): 595-602.
Humphreys et al., "Electronic nose analysis of bronchoalveolar lavage fluid." European journal of clinical Investigation 41.1 (2011): 52-58.
IC Compiler II. Synopsys, Inc. Accessed at https://www.synopsys.com/implementation-and-signoff/physical-implementation/ic-compiler.html on Mar. 2, 2021. 6 pages.
International Search Report and Written Opinion in International Application No. PCT/US2019/050286 dated May 19, 2020, 16 pages.
Zhang et al., "High-performance carbon nanotube complementary electronics and integrated sensor systems on ultrathin plastic foil." ACS nano 12.3 (2018): 2773-2779.
Zhang et al., "Selective etching of metallic carbon nanotubes by gas-phase reaction." Science 314.5801 (2006): 974-977.
Zhao et al., "Sub-10 nm diameter InGaAs vertical nanowire MOSFETs." Electron Devices Meeting (IEDM), 2017 IEEE International. IEEE, 2017. 4 pages.
Zhong et al., "Solution-processed carbon nanotubes based transistors with current density of 1.7 mA/μm and peak transconductance of 0.8 mS/μm." 2017 IEEE International Electron Devices Meeting (IEDM). IEEE, 2017. 5 pages.
Ebrahimi et al., "Monolithic 3D integration advances and challenges: From technology to system levels." 2014 SOI-3D-Subthreshold Microelectronics Technology Unified Conference (S3S). IEEE, 2014. 2 pages.
Extended European Search Report in European Patent Application No. 19814933.8 dated Dec. 23, 2021, 8 pages.
Chen, A Breath Sensor Based on Carbon Nanotubes and System Design, Journal of Zhengzhou University (Natural Science Edition) Year 2010, Issue 3, pp. 80-83.
Office Action and Search Report (with translation) in Chinese App. 201980050247.5 dated Dec. 5, 2022, 21 pages.
Schnabel et al. "Analysis of volatile organic compounds in exhaled breath to diagnose ventilator-associated pneumonia." Scientific Reports 5.1 (2015): 1-10.
Second Office Action (with translation) in Chinese App. 201980050247.5 dated Jun. 21, 2023, 15 pages.

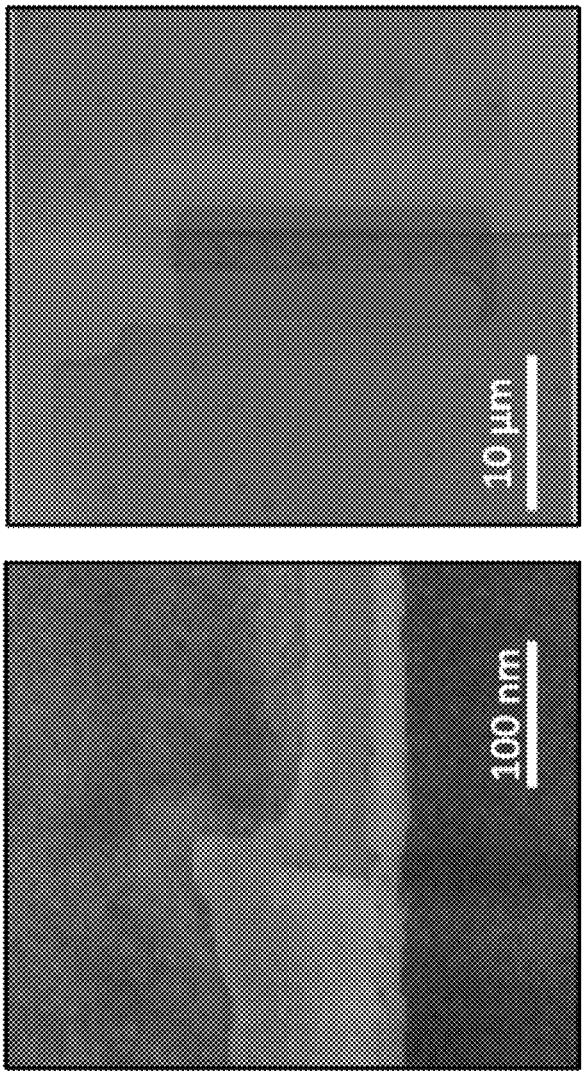

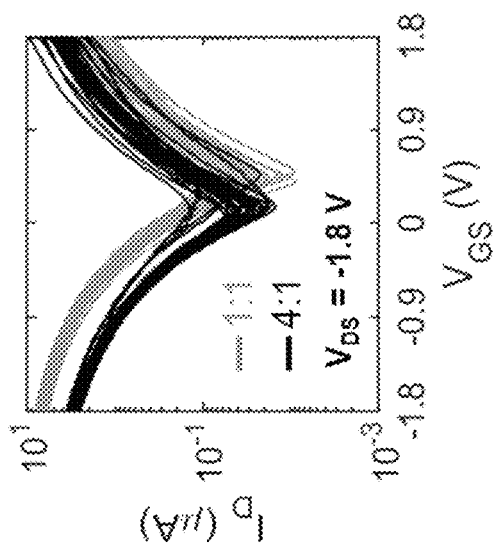
FIG. 2A
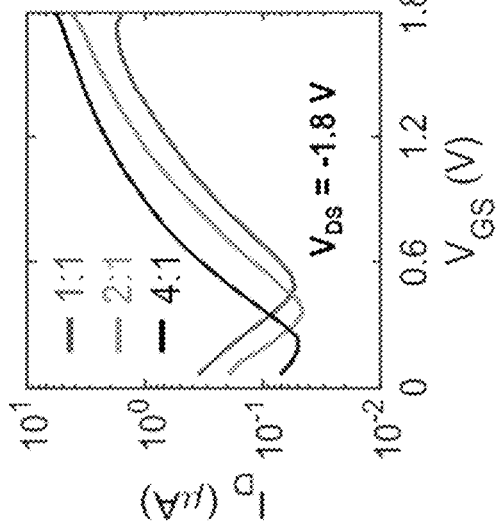
FIG. 2B
FIG. 2C
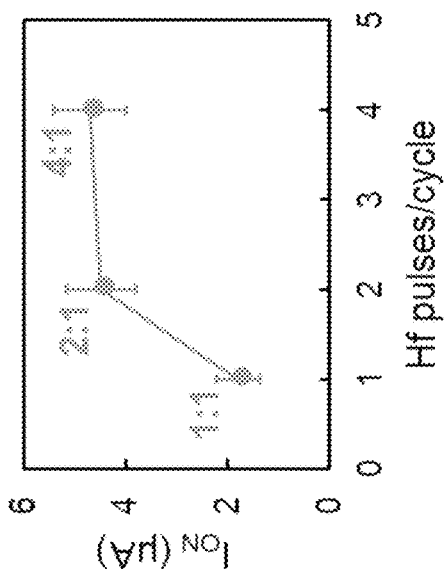
FIG. 2D
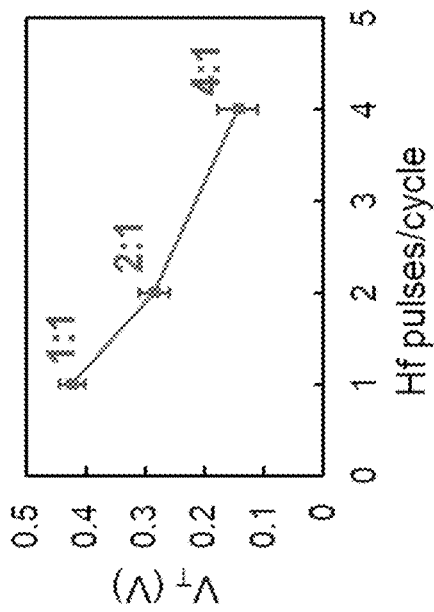
FIG. 2E

FIG. 8A $\quad I_D = \dfrac{2q}{h} \displaystyle\int_{E_c}^{\infty} T(E) f(E) dE$

FIG. 8B $\quad T(E) = \begin{cases} \exp\left( -\dfrac{8\pi}{3h} \sqrt{2m_e (\Phi_{SB}^* E)^3} \dfrac{x_d}{\Phi_{SB}^* - E_c} \right) & \text{for } E \leq \Phi_{SB}^* \\ 1 & \text{for } E > \Phi_{SB}^* \end{cases}$

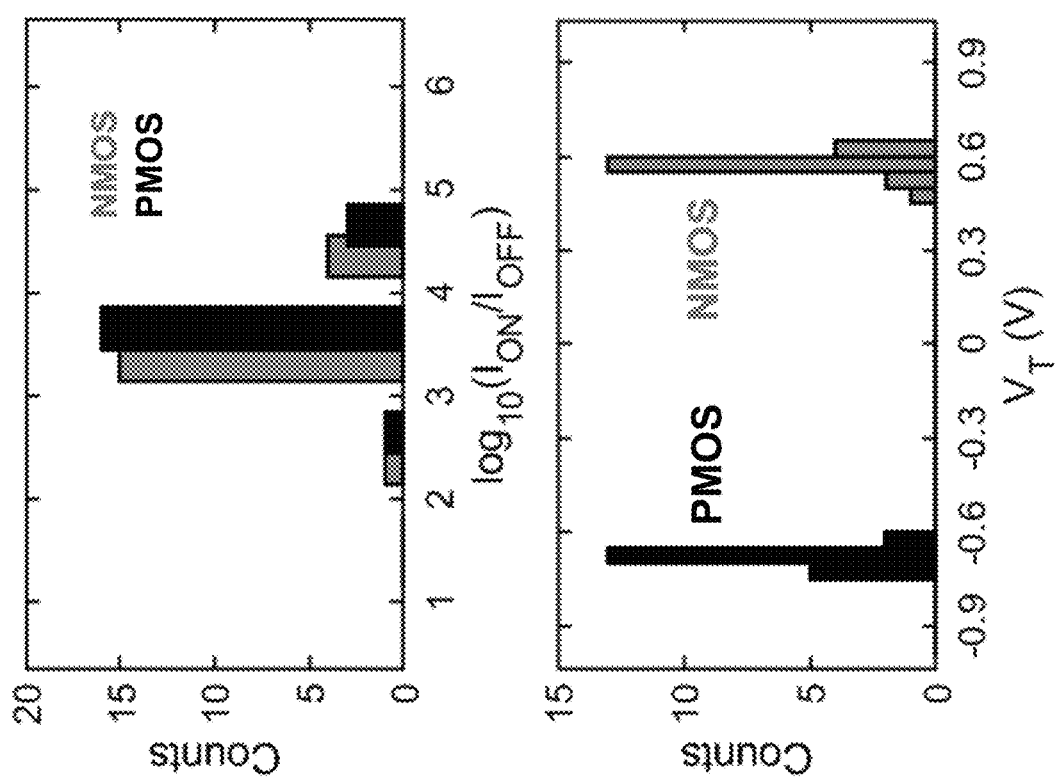
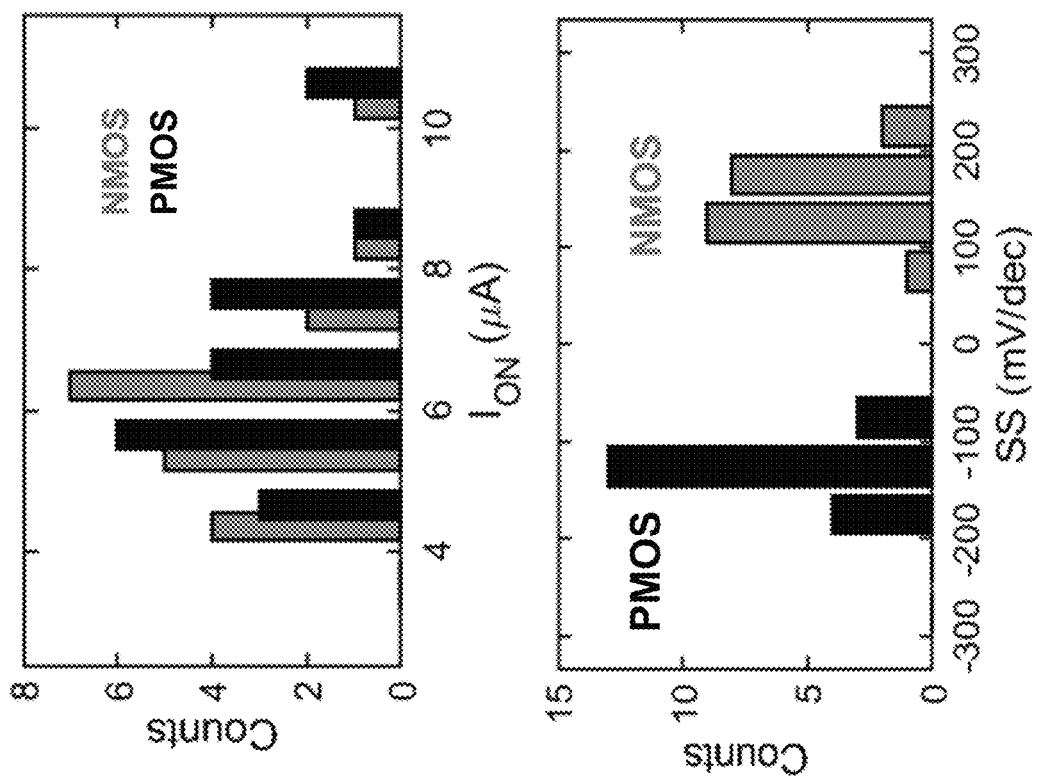

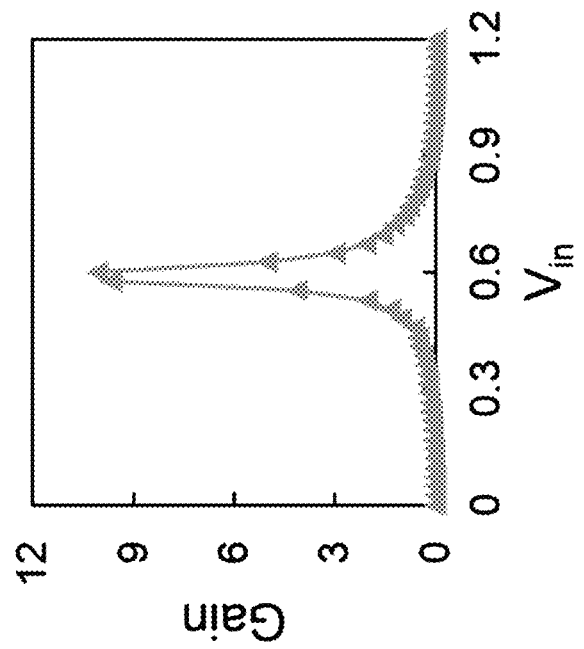
FIG. 10D
FIG. 10C
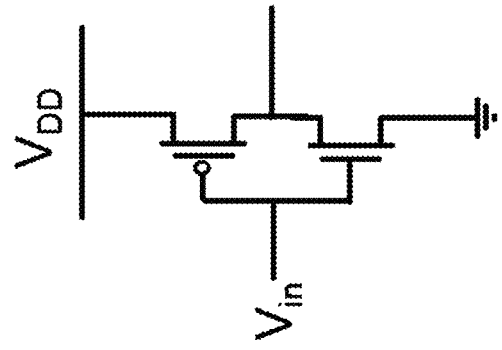
FIG. 10B

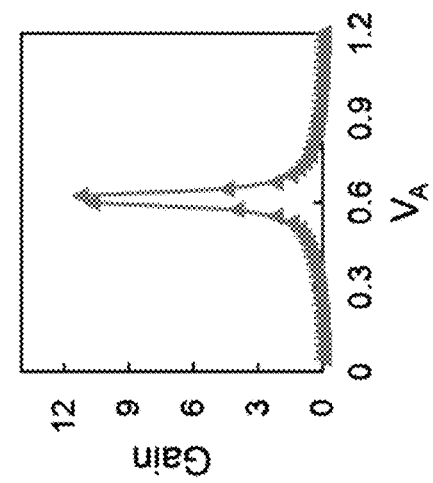
FIG. 11D
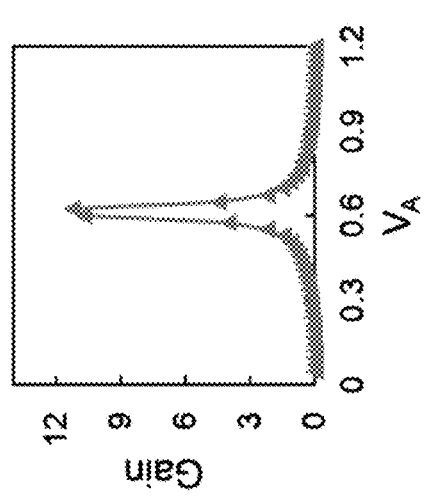
FIG. 11C
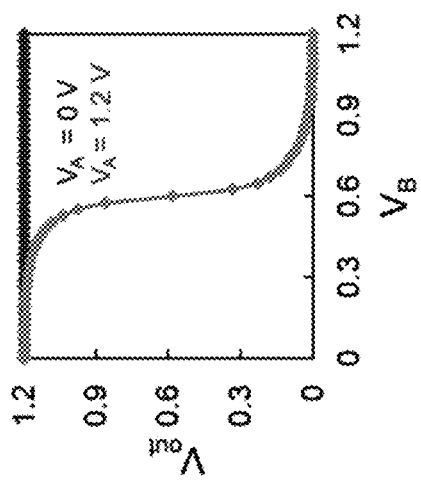
FIG. 11B
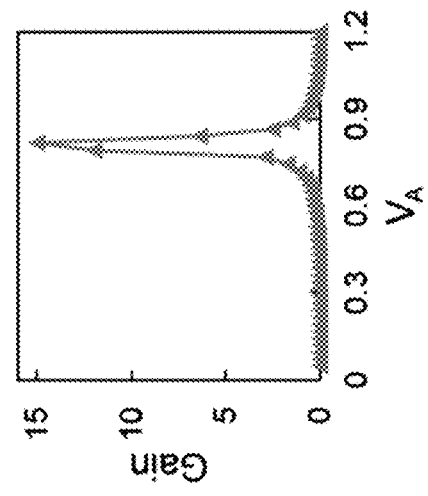
FIG. 11H
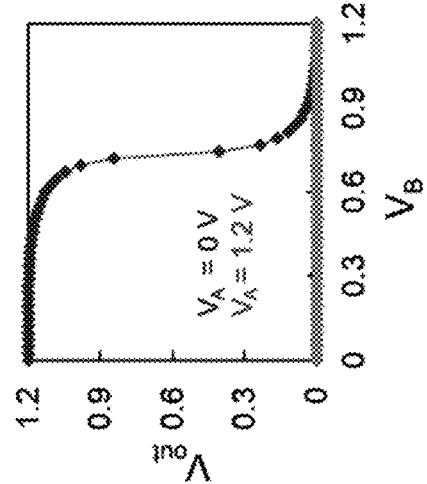
FIG. 11G
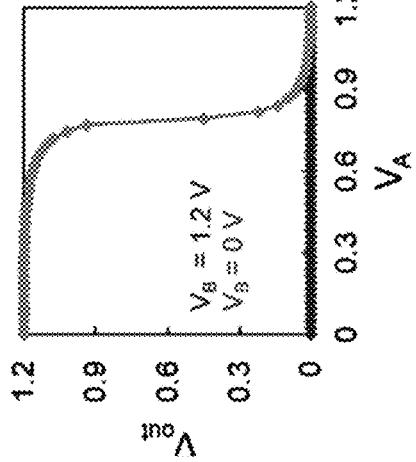
FIG. 11F
FIG. 11A
FIG. 11E

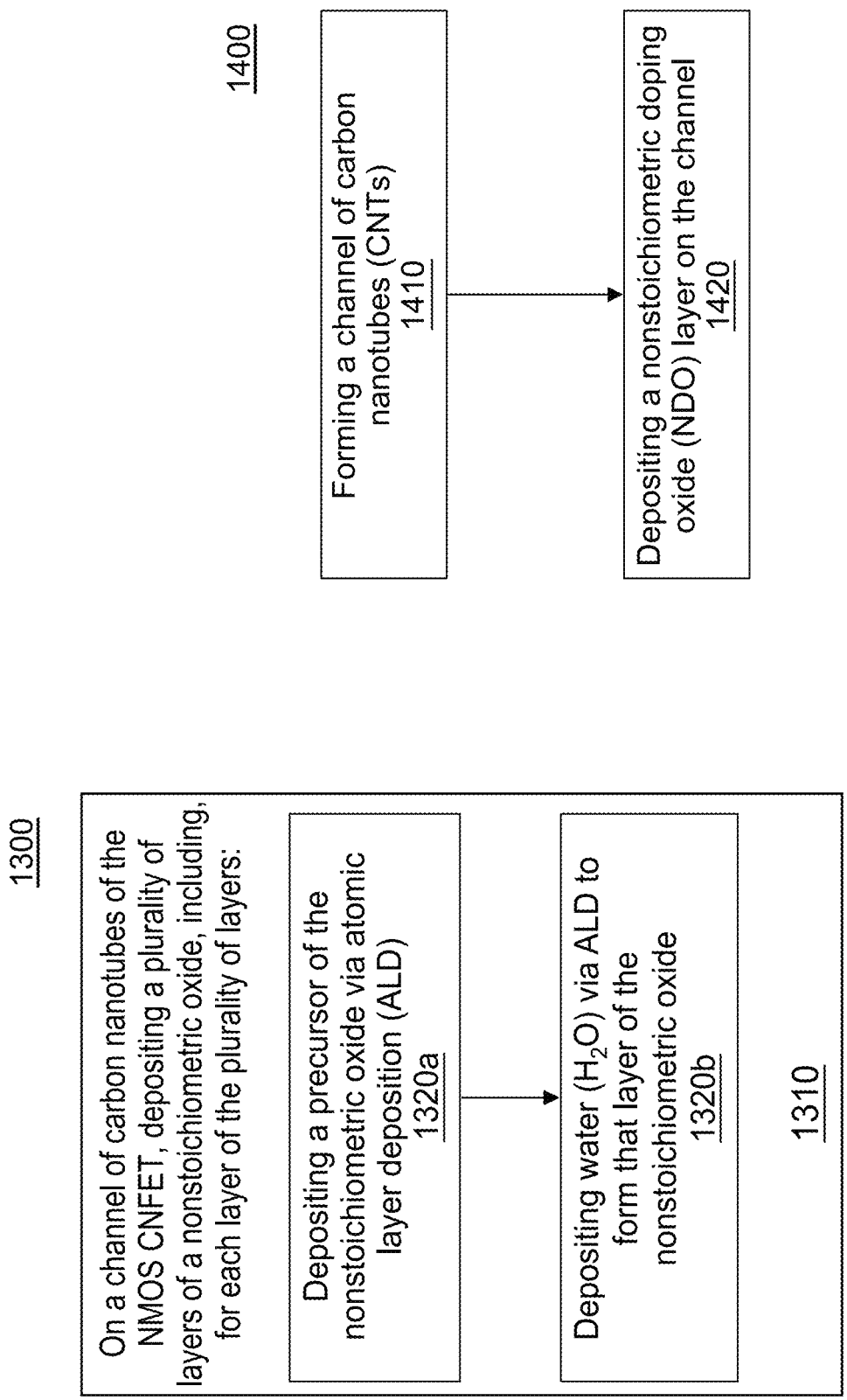

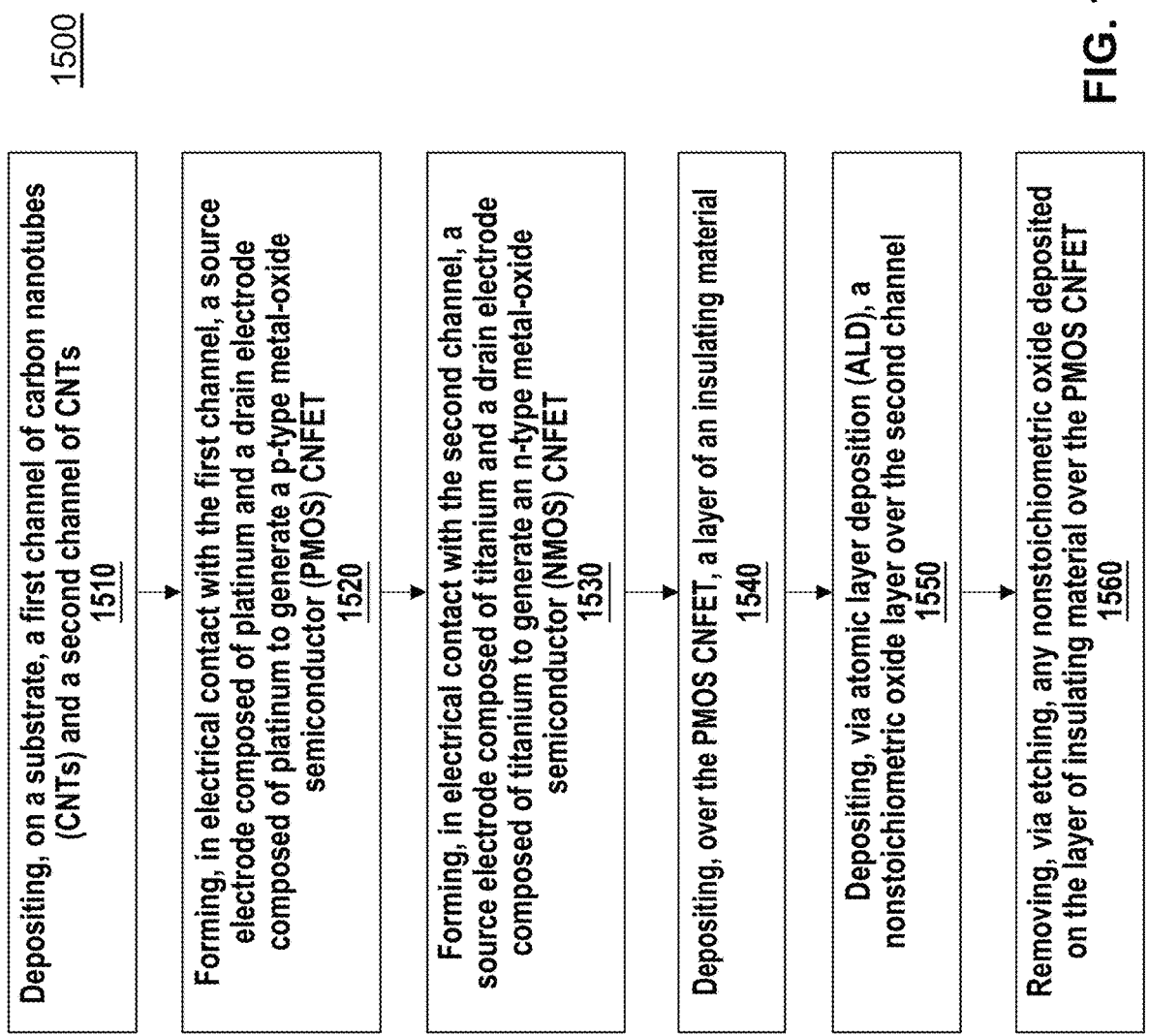

TUNABLE DOPING OF CARBON NANOTUBES THROUGH ENGINEERED ATOMIC LAYER DEPOSITION

CROSS-REFERENCE TO RELATED APPLICATIONS

This application is a by-pass continuation of International Application No. PCT/US2019/052675 titled "Tunable Doping of Carbon Nanotubes Through Engineered Atomic Layer Deposition," filed Sep. 24, 2019, which claims priority to U.S. Provisional Application No. 62/735,773 titled "Tunable n-Type Doping of Carbon Nanotubes Through Engineered Atomic Layer Deposition $HfO_X$ Films", filed Sep. 24, 2018, each of which is incorporated herein by reference.

GOVERNMENT SUPPORT

This invention was made with government support under W909MY-16-1-0001 awarded by the Defense Advanced Research Projects Agency. The government has certain rights in the invention.

BACKGROUND

As performance benefits with silicon-based computing systems are suffering from diminishing returns, alternative technologies are being pursued. Carbon nanotubes (CNTs) are an attractive emerging nanotechnology to build digital very large scale integrated (VLSI) circuits, owing to their superior carrier transport with simultaneously ultra-thin body (~1 nm diameter). Carbon nanotube field effect transistors (CNFETs) are projected to improve energy efficiency of digital VLSI circuits by an order of magnitude versus silicon complementary metal-oxide-semiconductor (CMOS) (quantified by energy-delay product (EDP)), while simultaneously enabling new opportunities for additional energy efficiency benefits (e.g., for new system architectures such as monolithic three-dimensional integrated systems). Over the last decade, significant progress with CNT technology has transformed CNTs from a scientifically interesting material to a potential supplement to silicon CMOS for next-generation high performance digital systems: high performance PMOS CNFETs competitive with silicon FETs, controlled CNT placement, and complete digital systems (fabricated entirely with PMOS CNFETs) have all been experimentally demonstrated.

Despite this progress, a major remaining obstacle facing CNFETs is the ability to dope CNTs to realize CNFET CMOS circuits integrating p-type metal-oxide semiconductor (PMOS) and n-type metal-oxide semiconductor (NMOS) CNFETs. Specifically, it remains a challenge to dope CNTs to reliably form NMOS CNFETs. While a range of previous efforts have fabricated NMOS CNFETs, no technology available today satisfies the following desirable characteristics for a CNFET CMOS technology:

1) tunable doping: simply realizing NMOS and PMOS CNFETs is insufficient; digital systems require a range of doping values to precisely set device parameters, such as threshold voltage ($V_T$),
2) silicon CMOS compatible: solid-state and silicon CMOS compatible materials are usually required for ease of integration in current commercial fabrication facilities,
3) air stable: the process should be air stable (both during and post-processing), to avoid changing device performance and/or increased variability, and
4) uniform and robust: to yield a digital VLSI system, potentially comprising billions of CNFETs, any doping should be highly reproducible and uniform across devices on the same sample and devices across multiple samples.

For instance, many existing techniques for realizing NMOS CNFETs rely on low work function metal source/drain contacts such as scandium, erbium, lanthanum, or calcium. These materials are extremely air-reactive, are not silicon CMOS compatible and, due to their reactivity, are also not usually uniform or robust (they either significantly increase device variability compared to PMOS CNFET variability, or do not always yield NMOS CNFETs). Similarly, alternative doping strategies leveraging reactive molecular dopants similarly rely on materials not used in conventional silicon CMOS processing. Those materials contain contaminants (e.g., ionic salts) that are prohibited from commercial fabrication facilities, are often unstable in air, and are not solid-state. NMOS CNFETs have also been realized by encapsulating CNTs with dielectrics, but such methods have not simultaneously demonstrated both tunable and robust n-type doping.

SUMMARY

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

A carbon nanotube field effect transistor (CNFET) includes a source electrode and a drain electrode. The CNFET also includes a channel formed between the source electrode and the drain electrode. The channel includes one or more carbon nanotubes (CNTs), and each layer includes a nonstoichiometric oxide.

A method of doping an n-type metal-oxide semiconductor (NMOS) carbon nanotube field effect transistor (CNFET). The method includes, on a channel of carbon nanotubes of the NMOS CNFET, depositing layers of a nonstoichiometric oxide. The depositing includes, for each layer of the nonstoichiometric oxide, a) depositing a precursor of the nonstoichiometric oxide via atomic layer deposition (ALD), and b) depositing water ($H_2O$) via ALD to form that layer of the nonstoichiometric oxide.

An integrated circuit includes at least one p-type metal-oxide semiconductor (PMOS) carbon nanotube field effect transistor (CNFET), and at least one n-type metal-oxide semiconductor (NMOS) CNFET.

A carbon nanotube field effect transistor (CNFET) includes a channel formed of carbon nanotubes (CNTs), and a nonstoichiometric doping oxide (NDO) layer, disposed within about 10 nm of the channel, to electrostatically dope the CNTs.

A process of making a carbon nanotube field effect transistor (CNFET) includes forming a channel of carbon nanotubes (CNTs), and depositing a nonstoichiometric doping oxide (NDO) layer on the channel.

A method of fabricating a complementary metal-oxide semiconductor carbon nanotube field effect transistor (CMOS CNFET) includes depositing, on a substrate, a first channel of carbon nanotubes (CNTs) and a second channel of CNTs. The method also includes forming, in electrical contact with the first channel, a source electrode composed of platinum and a drain electrode composed of platinum to generate a p-type metal-oxide semiconductor (PMOS) CNFET. The method also includes forming, in electrical contact with the second channel, a source electrode composed of titanium and a drain electrode composed of titanium to generate an n-type metal-oxide semiconductor (NMOS) CNFET. The method further includes depositing, over the PMOS CNFET, a layer of an insulating material and depositing, via atomic layer deposition (ALD), a nonstoichiometric oxide layer over the second channel. The method also includes removing, via etching, nonstoichiometric oxide deposited on the layer of insulating material over the PMOS CNFET.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1C is a cross-sectional scanning electron microscopy (SEM) image of a fabricated global back-gate CNFET encapsulated in NDO.

FIG. 1D is a top-view SEM image of the CNFET of FIG. 1C.

FIG. 2A is a plot illustrating change in percentage Hf content with increasing Hf precursor:$H_2O$ pulse ratio for tunable doping with $HfO_X$.

FIG. 2B is a plot of drain current versus gate-source voltage ($I_D$-$V_{GS}$) characteristics for CNFETs doped with Hf precursor:$H_2O$ ratios of 1:1, 2:1, and 4:1 (measured with drain-source voltage $V_{DS}$=−1.8V).

FIG. 2C is a plot/comparison of two sets of 35 CNFETs doped with 4:1 and 1:1 Hf:$H_2O$ ratios.

FIG. 2D is a plot illustrating corresponding average threshold voltage ($V_T$) shift with increasing Hf precursor:$H_2O$ pulse ratio.

FIG. 2E is a plot illustrating average n-branch ON-current ($I_{ON}$) for each type of NMOS CNFET with error bars indicating 99% confidence interval (sample size: 105 CNFETs). ON-current is extracted as the drain current at $|V_{GS}|=|V_{DS}|=|V_{DD}|$, where $V_{DS}$=drain-source voltage and $V_{DD}$=voltage at drain.

Figure 3A:
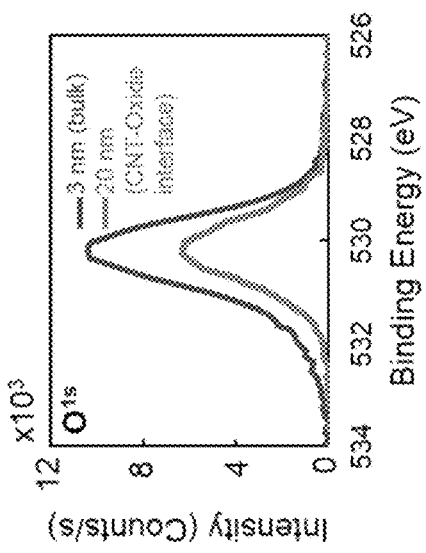

FIG. 3A is a plot of an X-ray photoelectron spectroscopy (XPS) depth profile of $HfO_X$ film from surface to $HfO_X$-CNT interface. To increase Hf concentration in the first atomic layers, the wafer is pre-treated with 50 pulses of Hf precursor (no $H_2O$), followed by 20 nm 3:1 $HfO_X$ deposition. XPS confirms that the first few atomic layers reach >52% Hf, while the bulk has ~38% Hf.

Figure 3B:
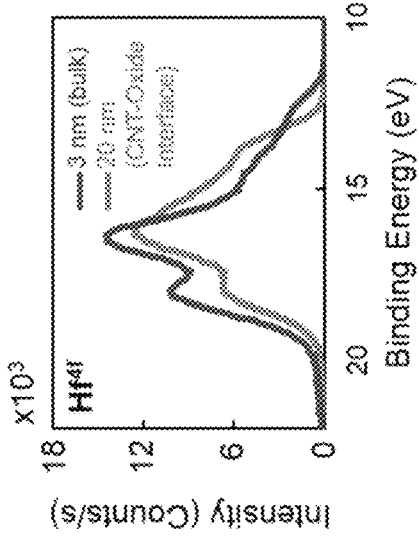

FIG. 3B is a plot illustrating $Hf^{4f}$ peaks at 3 nm depth (bulk $HfO_2$ film) and 20 nm depth (CNT-$HfO_2$ interface).

Figure 3C:
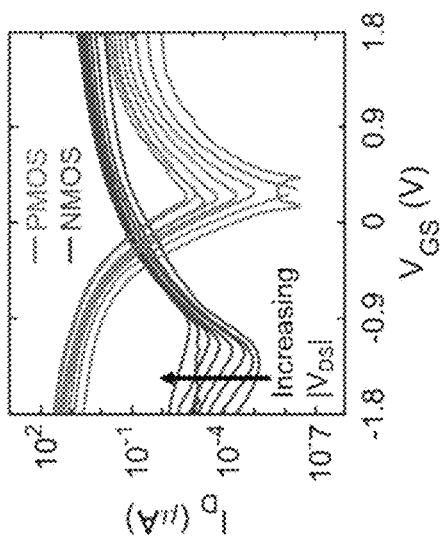

FIG. 3C is a plot illustrating $O^{1s}$ peaks at 3 nm depth (bulk $HfO_2$ film) and 20 nm depth (CNT-$HfO_2$ interface).

Figure 3D:
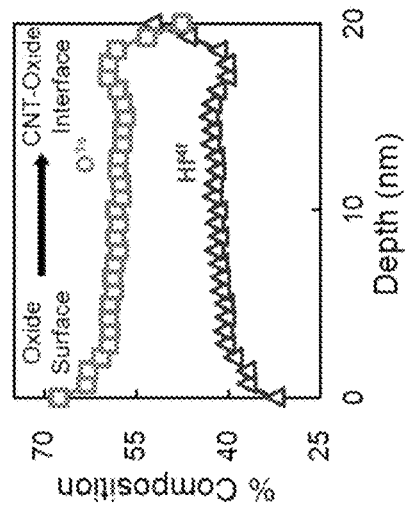

FIG. 3D is a schematic of a CNFET identifying the NDO oxide surface and CNT-oxide interface.

Figure 3E:
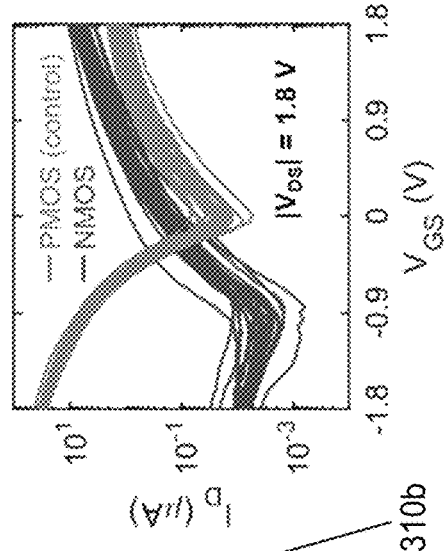

FIG. 3E is a plot illustrating $I_D$-$V_{GS}$ curves of 35 CNFETs before (i.e., formed as PMOS CNFETs) and after n-type doping with Hf-rich CNT-oxide interface measured at $V_{DS}$=−1.8 V and $V_{DS}$=1.8 V, respectively. The difference in ON-current between the PMOS and NMOS CNFETs is caused by all of these CNFETs using platinum metal source and drain contacts (see FIG. 5 for additional details).

Figure 3F:
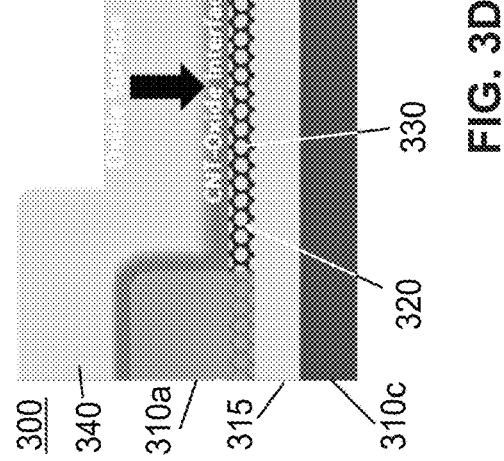

FIG. 3F is a plot illustrating $I_D$-$V_{GS}$ curves with Vis swept from −0.2 V to −1.8 V in −0.2 V steps for the PMOS CNFETs and 0.2 V to 1.8 V in 0.2 V steps for the NMOS CNFETs.

Figure 4:
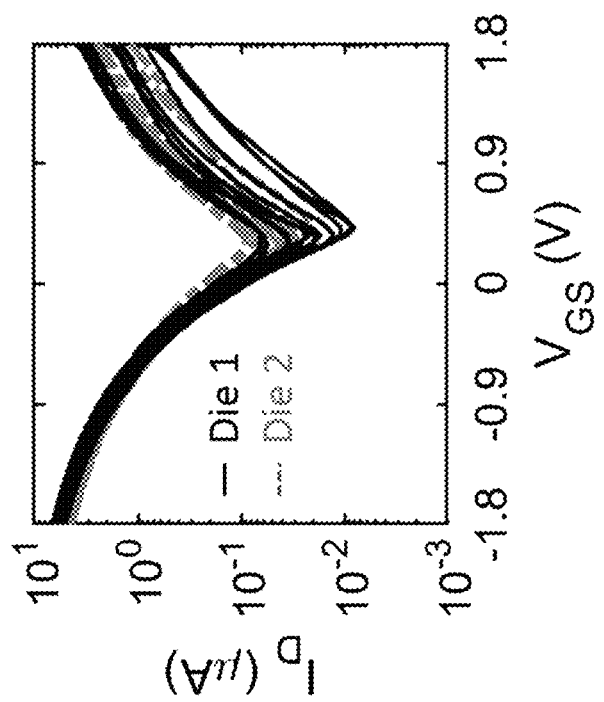

FIG. 4 is a plot illustrating a comparison of two independently processed wafers containing CNFETs identically doped with 3:1 Hf:$H_2O$ ratios, demonstrating reproducibility. $I_D$-$V_{GS}$ plots are measured at $V_{DS}$=1.8V.

Figure 5C:
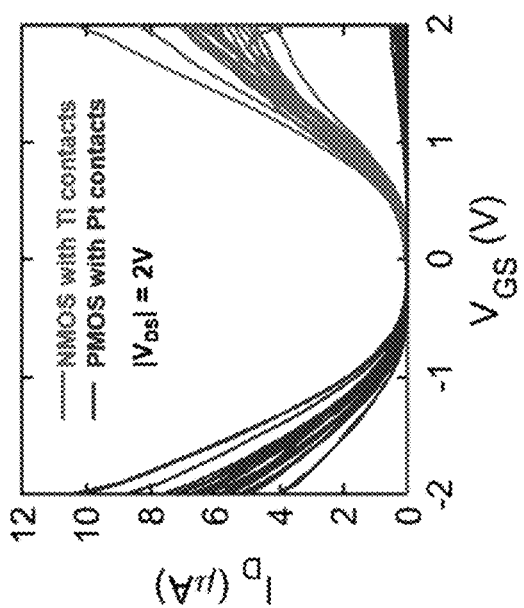
Figure 5B:
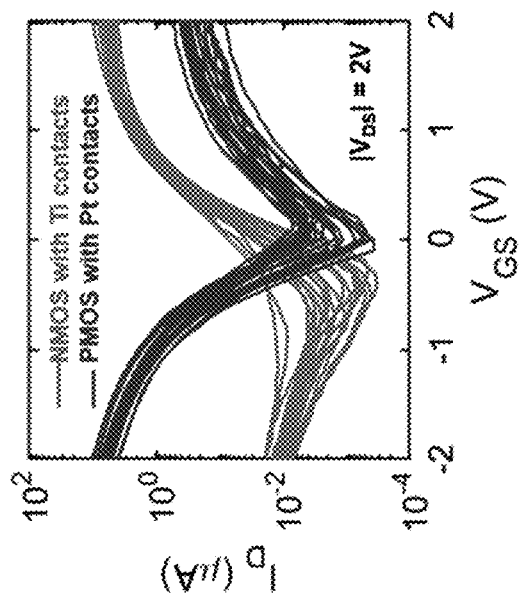
Figure 5A:
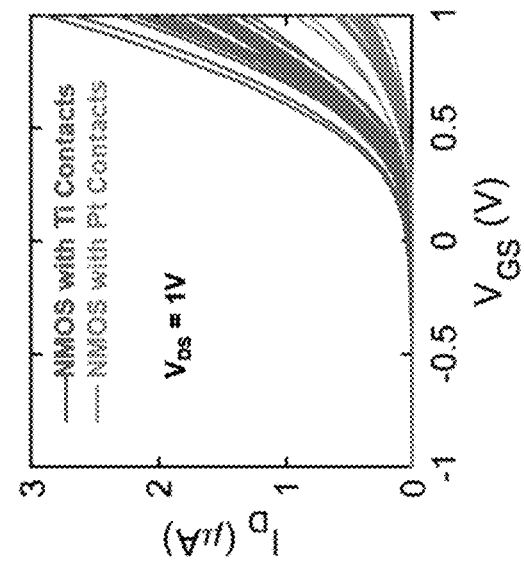

FIG. 5A is a plot of $I_D$ versus $V_{GS}$ (linear scale) for NDO encapsulated NMOS CNFETs with titanium contacts (upper traces) and platinum contacts (lower traces).

FIG. 5B is plot of $I_D$ (log scale) versus $V_{GS}$ comparing 20 NDO encapsulated NMOS CNFETs with titanium contacts and 20 PMOS CNFETs with platinum contacts.

FIG. 5C is the plot of FIG. 5B with $I_D$ plotted on a linear scale.

Figure 6:
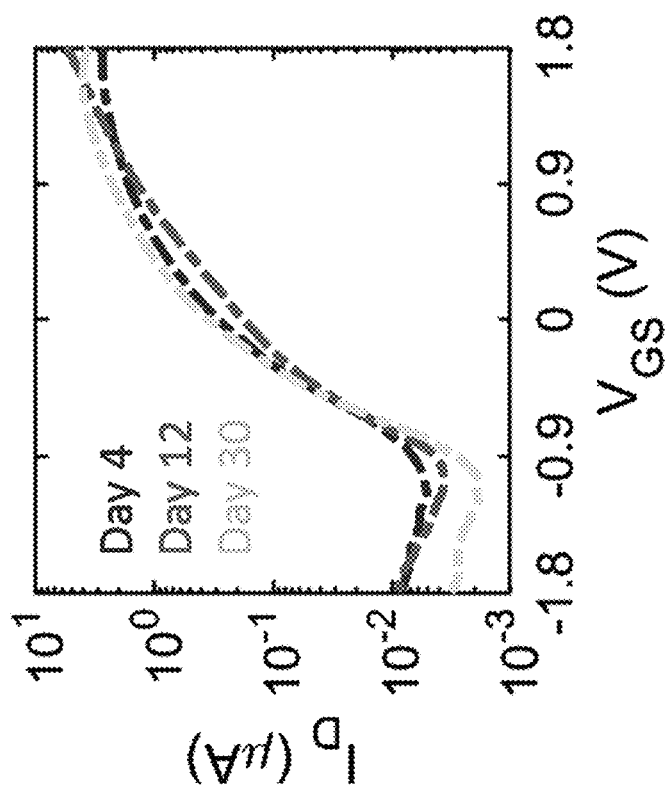

FIG. 6 is a plot of $I_D$ versus $V_{GS}$ for a CNFET measured in air and under ambient temperature conditions at $V_{DS}$=1.8V at different time intervals after fabrication, demonstrating air-stability.

Figure 7:
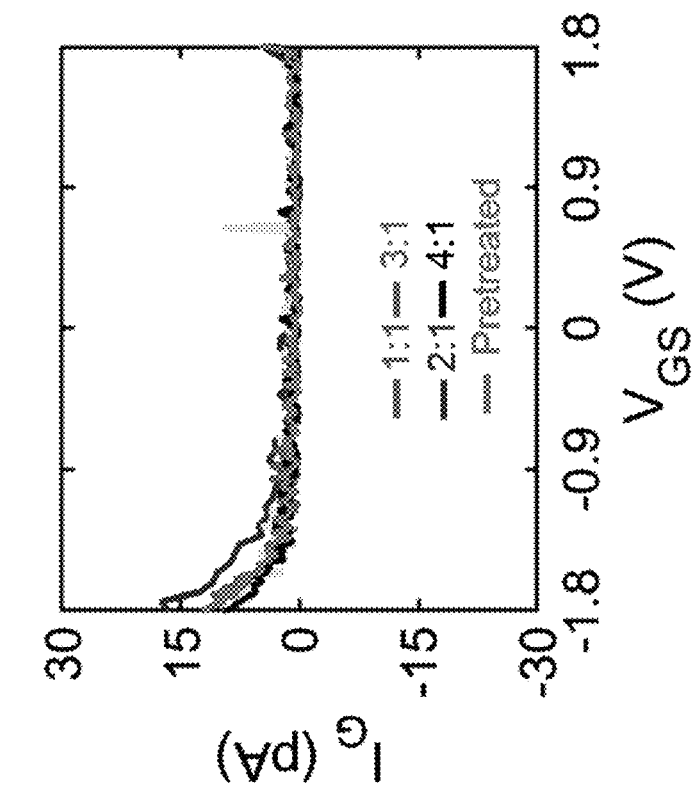

FIG. 7 is a plot illustrating gate leakage of CNFETs doped with nonstoichiometric $HfO_X$.

FIG. 8A is a Landauer formulation for calculating the current due to carrier transport across a potential barrier where f(E) is the Fermi-Dirac distribution and T(E) is the transmission coefficient through the barrier.

FIG. 8B is a Wentzel-Kramers-Brillouin (WKB) approximation of the probability of electron transmission through a triangular Schottky barrier. The effective Schottky barrier height ($\Phi^*_{SB}$) is taken as a fitting parameter to determine the appropriate effective Schottky barrier height for an experimental CNFET. $m_c$ is the effective tunneling mass for electrons, $E_c$ is the conduction band which is modulated by the gate voltage, and $x_d$ is the depletion width of the Schottky barrier.

Figure 8C:
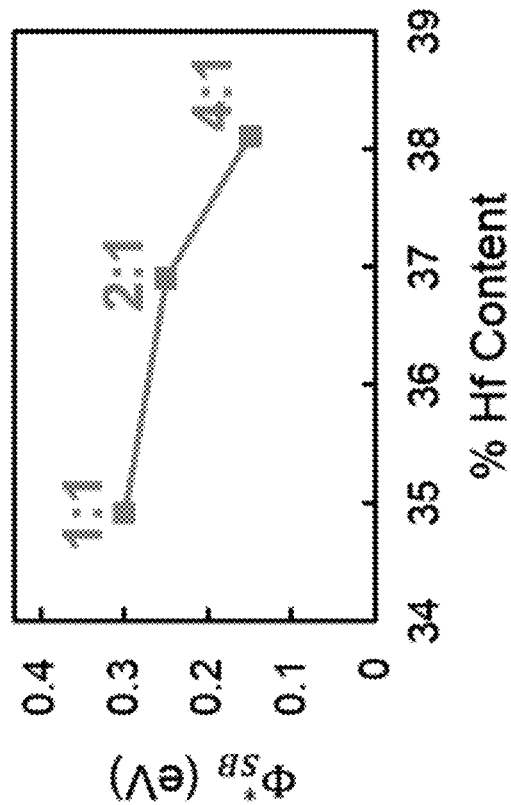

FIG. 8C is a band diagram of a CNT and its source/drain metal contacts, and illustrates the effect of $\Phi^*_{SB}$ on the carrier transport from the source contact metal to CNT.

Figure 8D:
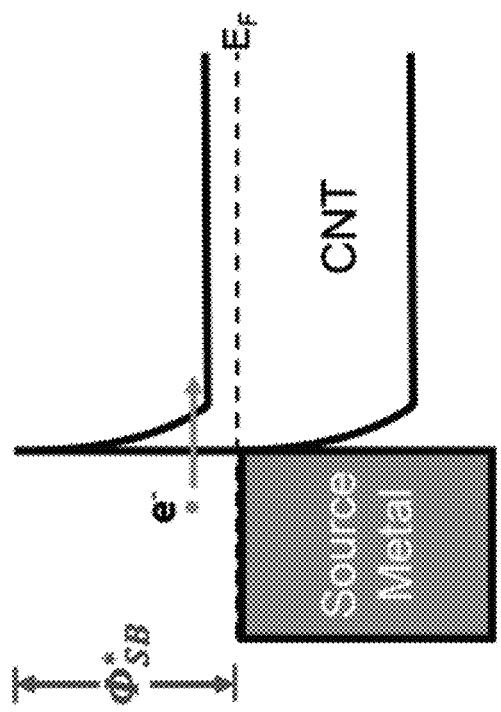

FIG. 8D is a plot relating $\Phi^*_{SB}$ to the hafnium content in $HfO_X$ NDO films encapsulating NMOS CNFETs. NDO films with greater Hf content exhibit a lower $\Phi^*_{SB}$, reducing the barrier for electron transport and strengthening n-type conduction. Similar relations can be calibrated to other oxides besides $HfO_X$ for the NDO layer.

FIG. 9A is a plot of ON-current distribution for NMOS CNFETs, measured with $V_{DS}$=$V_{GS}$=2 V (average: $\mu_{ION,N}$=6.24 µA and standard deviation: $\sigma_{ION,N}$=1.42 µA) and PMOS CNFETs, measured with $V_{DS}$=$V_{GS}$=−2 V (average: $\mu_{ION,P}$=6.60 µA and standard deviation: $\sigma_{ION,P}$=1.74 µA).

FIG. 9B is a plot of distribution of $\log_{10}(I_{ON}/I_{OFF})$ for NMOS CNFETs (average: 3.63 and standard deviation: 0.42) and PMOS CNFETs (average: 3.58 and standard deviation: 0.35).

FIG. 9C is a plot of distribution of maximum subthreshold slope for NMOS (mean: $\mu_n$=153.7 mV/decade and standard deviation: $\sigma_n$=38.1 mV/decade) and PMOS (mean: $\mu_p$=125.4 mV/decade and standard deviation: $\sigma_p$=24.5 mV/decade) CNFETs.

FIG. 9D is a plot of threshold voltage distribution for NMOS CNFETs (mean: $\mu_{VT,N}$=0.57 V and $\sigma_{VT,N}$=0.03 V) and PMOS CNFETs (mean: $\mu_{VT,P}$=−0.68 V and standard deviation: $\sigma_{VT,P}$=0.03 V). The threshold voltage of each CNFET was calculated using the extrapolation in linear region (ERL) method, where the $I_D$-$V_{GS}$ characteristic is linearly extrapolated at its point of highest slope and intersects the gate voltage axis at the threshold voltage.

Figure 10A:
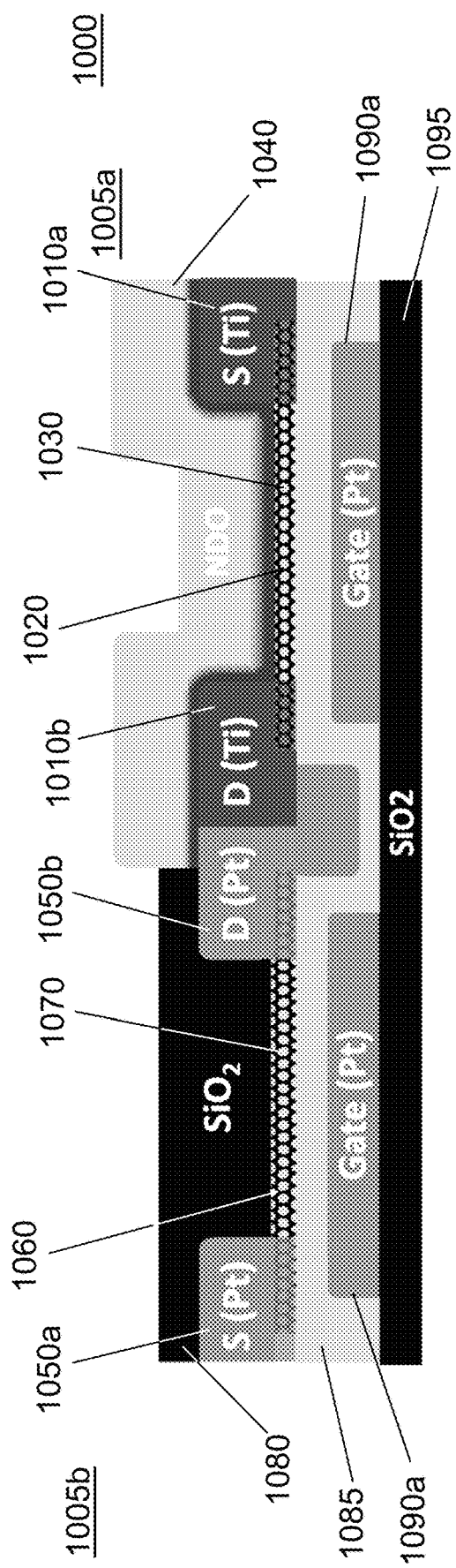

FIG. 10A illustrates a static CMOS inverter fabricated by combining NDO encapsulation with lower work-function contact engineering. FIG. 10A shows a cross sectional schematic of local-back gate PMOS and NMOS CNFETs fabricated on the same die.

FIG. 10B is a circuit schematic for CMOS inverter of FIG. 10A.

FIG. 10C is a voltage transfer curve for the fabricated CNFET inverter of FIG. 10A operating at a $V_{DD}$ of 1.2V. When $V_{in}$=0 V, $V_{out}$ reaches 99.92% of $V_{DD}$ and when $V_{in}$=$V_{DD}$, $V_{out}$ reaches 0.03% of $V_{DD}$.

FIG. 10D is a plot of inverter gain (change in $V_{OUT}$ over change in $V_{IN}$) versus $V_{in}$ where the gain reaches a maximum of 10.

FIG. 11A is a circuit diagram for a static CMOS "not-and" (NAND2) logic gate.

FIG. 11B is a voltage transfer curve for the NAND2 gate of FIG. 11A when input voltage $V_A$ is swept from 0 to 1.2 V.

FIG. 11C is a voltage transfer curve for the NAND2 gate of FIG. 11A when input voltage $V_B$ is swept from 0 to 1.2 V.

FIG. 11D is a plot of NAND2 gate gain versus $V_A$ (with $V_B$=$V_{DD}$) where a maximum gain of 11 is achieved.

FIG. 11E is a circuit diagram for CMOS NOR2 logic gate.

FIG. 11F is a voltage transfer curve for the NOR2 gate of FIG. 11E when the input $V_A$ is swept from 0 to 1.2V.

FIG. 11G is a voltage transfer curve for the NOR2 gate of FIG. 11E when the input $V_B$ is swept from 0 to 1.2 V.

FIG. 11H is a plot of NOR2 gate gain versus $V_A$, where a maximum gain of 15 is achieved.

Figure 12A:
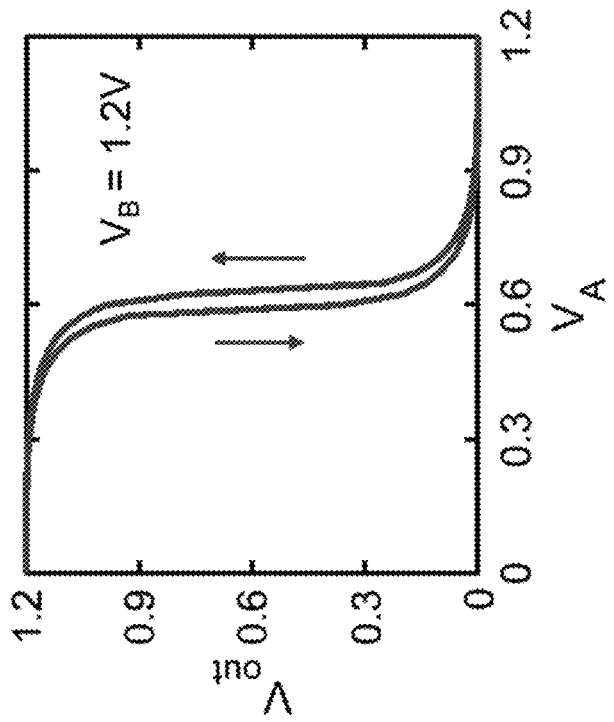

FIG. 12A is a plot illustrating hysteresis of a local back-gated CNFET fabricated with the same process as described for FIG. 10A. Arrows indicate direction of voltage sweep.

Figure 12B:
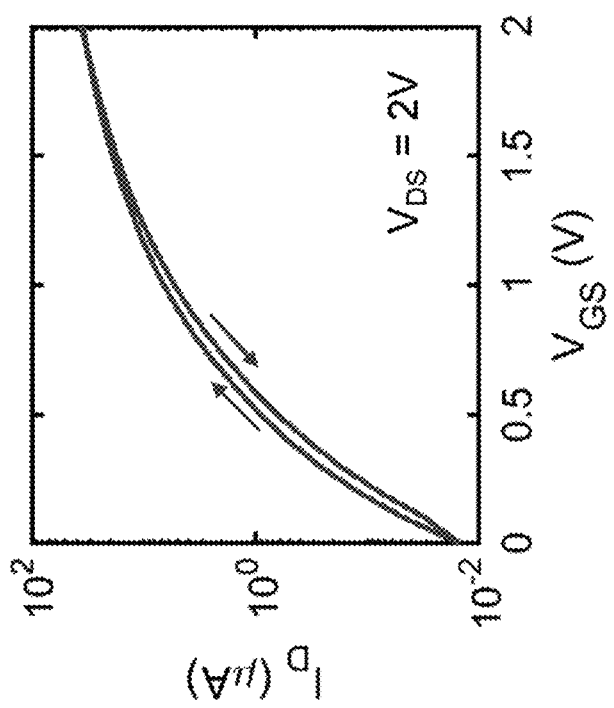

FIG. 12B is a plot illustrating hysteresis of the CMOS NAND2 logic gate of FIG. 11A. Arrows indicate direction of voltage sweep.

FIG. 13 is a flowchart for a method of doping an NMOS CNFET.

FIG. 14 is a flowchart for a process of making a CNFET.

FIG. 15 is a flowchart for a method of fabricating a CMOS CNFET.

DETAILED DESCRIPTION

While digital systems fabricated from CNFETs promise significant energy efficiency benefits, realizing these benefits involves a complementary CNFET technology, i.e., CNFET CMOS, comprised of both PMOS and NMOS CNFETs. Furthermore, this CNFET CMOS process should be robust (e.g., air-stable), tunable (e.g., ability to control CNFET threshold voltages), and silicon CMOS compatible (to integrate within existing manufacturing facilities and process flows). Despite many efforts, such a silicon CMOS-compatible CNT doping strategy for forming NMOS CNFETs does not exist. Techniques today are either not air-stable (e.g., use reactive low work function metals), not solid-state or silicon CMOS compatible (e.g., employ soluble molecular dopants in ionic solutions), or lack precise control over the amount of doping (e.g., for setting threshold voltage: $V_T$).

Described herein are electrostatic CNT doping methods/techniques for realizing CNFET CMOS technology that meets such requirements. The precise engineering of the stoichiometry of dielectrics (e.g., an oxide or nitride, such as for example a nonstoichiometric oxide, sometimes also referred to as a nonstoichiometric doping oxide or NDO, in this instance $HfO_X$) deposited over exposed CNTs in the channel of CNFETs results in tunable and robust CNT doping. Explained primarily with reference to NDOs as example dielectrics for convenience, to accomplish this, atomic layer deposition (ALD) can be employed, which allows for precise engineering of the stoichiometry of the NDO (e.g., modifying the Hf content at the $HfO_X$-CNT interface), which in turn results in fine-grained control over the amount of n-type doping, the relative strengths of the p-type and n-type conduction, and the threshold voltage. Also presented herein is a model that directly relates the stoichiometry of the $HfO_X$ NDO to an effective Schottky barrier height ($\Phi^*_{SB}$), enabling engineering of a given NDO stoichiometry to achieve a precise quantity of CNT doping.

CNFETs with ALD-Engineered Nonstoichiometric Oxide(s) Doping Layer(s)

Figure 1A:
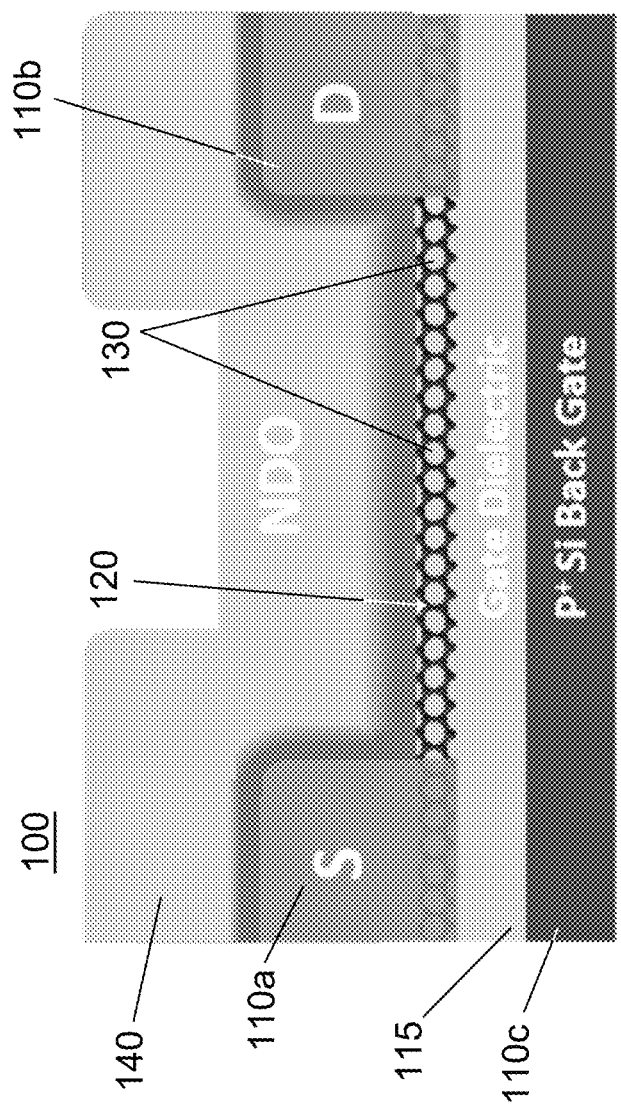
FIG. 1A illustrates the structure of a carbon nanotube field effect transistor (CNFET), and specifically is a schematic of an NMOS CNFET encapsulated by a nonstoichiometric doping oxide (NDO). The shaded region underneath the NDO represents the hafnium-rich oxide at the carbon nanotube (CNT)-NDO interface.

As a general CNFET design that is explained in more detail below, FIG. 1A illustrates such a CNFET 100 that includes a source electrode 110 and a drain electrode 120. The source electrode 110 and/or the drain electrode 120 can be composed of titanium. The CNFET has a channel 120 formed between the electrodes 110a and 110b. This channel 120 includes carbon nanotube(s) (CNTs) 130. As also shown in FIG. 1A, one or more layers 140 are deposited on the CNTs, where each layer includes a nonstoichiometric oxide. The nonstoichiometric oxide can be or include hafnium oxide ($HfO_X$) and can serve to electrostatically dope the CNTs, though any suitable material can be used such as, for example, aluminum oxide, a nitride, a high-k dielectric material, an insulating material, etc. Different nonstoichiometric oxides can be deposited within a single layer and/or across multiple layers. Multiple layers can include the same nonstoichiometric oxide(s). For example, the layers 140 can include a first layer on the CNTs 130 having a first nonstoichiometric oxide, a second layer on the first layers having a second nonstoichiometric oxide, etc.

Generally, ALD can be used to encapsulate CNTs with nonstoichiometric oxides. ALD can allow for precise control of oxide stoichiometry within a layer and/or across layers, which can translate to direct control of the amount of CNT doping. Described and experimentally demonstrated here is the ability to modulate the strength of the p-type conduction branch by >2,500× (measured as the change in current at fixed bias), realize NMOS CNFETs with n-type conduction ~500× stronger than p-type conduction (also measured by the relative current at fixed biases), and tune $V_T$ over a ~1.5 V range. These techniques are compatible with other doping schemes; as an illustration, electrostatic doping and low work function contact engineering is combined to achieve CNFET CMOS with symmetric NMOS and PMOS (e.g., CNFET ON-current for NMOS and PMOS is within 6%-50% of each other). These techniques realize a solid-state, air stable, very-large scale integration (VLSI) and silicon CMOS compatible doping strategy, enabling integration of CNFET CMOS within standard fabrication processes.

One such general method for doping an NMOS CNFET (e.g., to form the CNFET 100) is illustrated in FIG. 13 as method 1300. The method 1300 includes, at step 1310, depositing layers (e.g., the layers 140) of a nonstoichiometric oxide on a channel of CNTs (e.g., the CNTs 130). This can further include two sub-steps 1320a and 1320b. At sub-step 1320a, a precursor (e.g., (Tetrakis(dimethylamido) hafnium(IV))) of the nonstoichiometric oxide (e.g., hafnium oxide ($HfO_X$)) is deposited via ALD. At sub-step 1320b, water is deposited via ALD to form that layer of the nonstoichiometric oxide. The thickness of the deposited layers can be from about 10 nm to about 20 nm, including all values and sub-ranges in between.

Several timing aspects related to the steps 1310, 1320a, and 1320b can be manipulated as desired. For example, the durations of step 1320a and/or step 1320b can be different between two or more layers 140, and each can be from about a millisecond to about a minute, including all values and sub-ranges in between. This can occur if depositing the precursor takes longer than depositing the water or vice versa, e.g., because more precursor is deposited, because the precursor is deposited more slowly, the layer stoichiometry varies, etc. Further, there can be a waiting period between steps 1320a and 1320b for any given layer. The duration of such a waiting period can be different for different layers, and can be from about a millisecond to about a minute, including all values and sub-ranges in between. The ratio of such a duration (e.g., of multiple pulses, or of a single pulse) of step 1320a to step 1320b for a first layer can be different than such a ratio for a second layer. For example, the ratio of any given layer can independently be 1:1, 2:1, 3:1, 4:1, 1:4, 1:3, 1:2, including any sub-values for either value of duration. The first layer can be the layer that is deposited directly on the CNTs and the second layer can be one that is deposited on the first layer and/or after the first layer. The ratio for the first layer can be greater than the ratio for the second layer. As an example, multiple pulses (or a single long pulse) of the Hf-precursor followed by a single pulse of water can be employed to make the resulting layer Hf-rich. In contrast, a single pulse of Hf-precursor followed by many pulses/one longer pulse of water creates an oxygen-rich layer. As a general explanation, when the layers 140 are deposited under vacuum, the deposition process can create a spike in pressure, which can be removed during such waiting periods. Waiting for relatively longer can more fully remove any excess precursor and/or water than if the waiting period is relatively shorter.

There can also be a waiting period between depositing different layers, i.e., between step 1320b for one layer and step 1320a for the next layer. The duration of such waiting between depositing any two layers can be different than a duration of such waiting between depositing any other two layers. For example, the duration of waiting between depositing layers 2 and 3 can be different than when depositing layers 3 and 4, or when depositing layers 5 and 6.

The method 1300 can further include annealing the NMOS CNFET after depositing the layers. Such annealing can be useful for passivating any electrically charged states that may have arisen in the deposited nonstoichiometric oxide. The annealing can be gas annealing, carried out in the presence of a mixture of nitrogen and hydrogen gas.

FIG. 14 illustrates a method 1400 for forming a CNFET, followed by doping such as generally explained for FIG. 13. At step 1410, a channel of carbon nanotubes (CNTs) (e.g., the channel 120 with the CNTs 130) is deposited and or otherwise formed. At step 1420, a nonstoichiometric doping oxide (NDO) layer is deposited on the channel (e.g., the layer(s) 140), such as via ALD. As explained for FIG. 13, such depositing can include varying a stoichiometry (i.e., varying some aspect of the reactants used) of the NDO layer. This can be accomplished by, for example, varying a ratio of the number of hafnium precursor pulses per water pulse used during the deposition of the NDO layer, by pretreating the channel of CNTs with hafnium precursor pulses prior to depositing the NDO layer, and/or by varying the duration of pretreatment of the channel of CNTs with hafnium precursor pulses prior to depositing the NDO layer. Such stoichiometry (of the NDO) layer can be selected, for example, based on a desired threshold voltage of the CNFET, based on a Schottky barrier height of the CNFET, etc. The NDO layer can be annealed in a forming gas mixture of nitrogen gas and hydrogen gas.

NDO doping can be combined with other doping schemes. As an example, NDO electrostatic doping is combined with low work function contact engineering to achieve CNFET CMOS with NMOS and PMOS that achieve similar ON-current, OFF-current, and threshold voltage magnitudes (sometimes referred to as "symmetric" NMOS and PMOS CNFETs). Due to the combined doping strategy, the contact metal does not need to have extremely low work function (<4 eV, such as Scandium), but rather can have a work function >4 eV, such as titanium (a silicon CMOS compatible metal) while still realizing symmetric NMOS and PMOS.

The NDO electrostatic doping does not degrade performance. For example, as described in greater detail later, $V_T$ variations, inverse subthreshold-slope, $I_{ON}/I_{OFF}$, and gate leakage of NMOS CNFETs fabricated in this manner are statistically similar to PMOS CNFETs.

CNFET static CMOS digital logic gates can have rail-to-rail swing (>99% of supply voltage) and high gain (>15). In the preceding sentence, "gain" refers to the ratio of the maximum absolute value of change in the output voltage to the input voltage ($\Delta V_{OUT}/\Delta V_{IN}$).

Example CNFET Fabrication

Figure 1B:
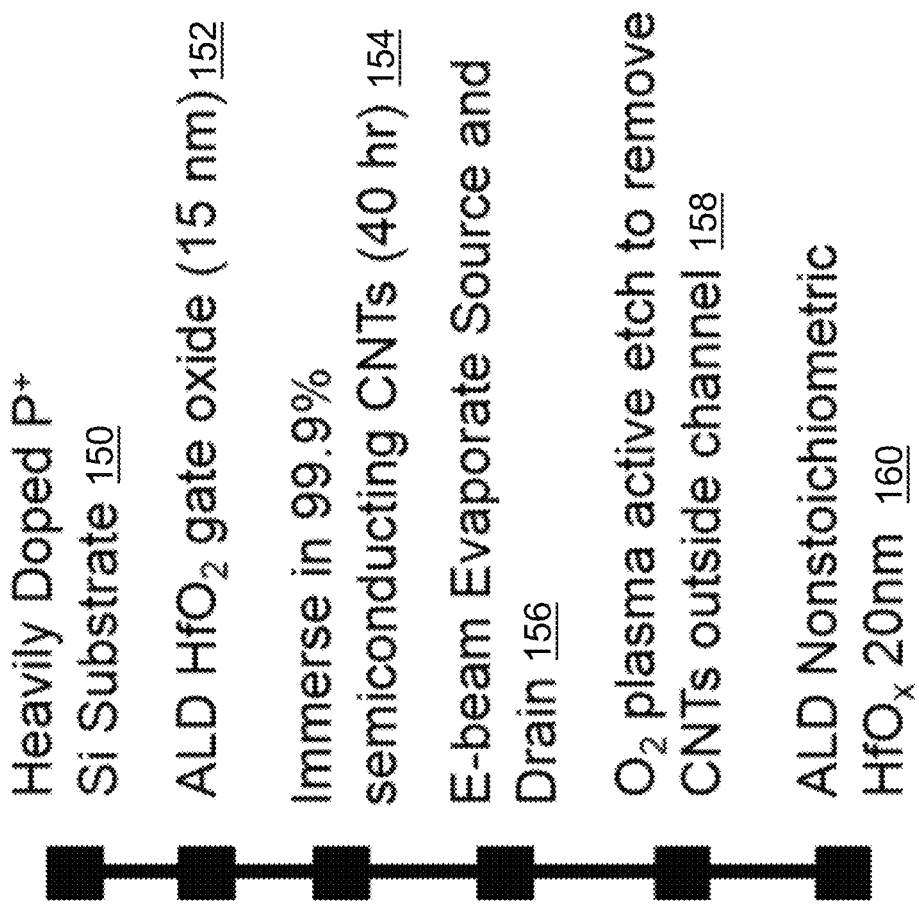
FIG. 1B is an example process flow for producing the CNFETs of FIG. 1A.

FIG. 1B is an example fabrication flow for the CNFET of FIG. 1A that extends the description of the methods of FIGS. 13 and 14 above, and FIGS. 1C and 1D are scanning electron microscope (SEM) images of the fabricated CNFET 100. Explained with reference to FIGS. 1A and 1B, the gate metal 110c (formed or deposited at step 150 of FIG. 1B) and high-k gate dielectric 115 (formed or deposited at step 152 of FIG. 1B) is fabricated first. The gate dielectric 115 can be a different oxide from the NDO 140, which is physically located on the other side of the channels 120 compared to the high-k gate dielectric. The channel 120 of CNTs 130 is formed at step 154 by immersion of the gate-dielectric structure in 99.9% semiconducting CNTs, forming a back-gate device structure. The source 110a and drain 110b contact are created at step 156 (e.g., via electron-beam physical vapor deposition), and an etch is performed at step 158 to remove any CNTs deposited outside the channels 120. Following this initial CNFET fabrication, an ALD-deposited nonstoichiometric doping oxide (NDO)—here, $HfO_X$—is deposited over the CNTs at step 160. The $HfO_X$ dopes the CNTs through electrochemical reduction (redox) of the CNTs in contact with hafnium, as well as through field-effect doping owing to the fixed charges in the $HfO_X$. By controlling the stoichiometry of the first atomic layers of the NDO, as well as the stoichiometry of the bulk NDO, one can precisely control both the amount of redox reaction at the $HfO_X$-CNT interface and the fixed charge, respectively.

The collective thickness of the layers 140 can be from about 4 nm to about 50 nm, including all values and sub-ranges in between. As an example, each individual layer 140 can be about 1 Angstrom. The layers 140 can be deposited to within 10 nm of the channel 120 and have a stoichiometry that varies with the thickness of the layers 140. The electrodes 110a, 110b can be formed of a CMOS-compatible metal having a work function of about 4 eV to about 5 eV such as titanium, for example. The layers 140 can have a stoichiometry that varies as a function of, and/or is otherwise based on, the work function.

The concentration of the nonstoichiometric oxide can be higher or lower in a layer (sometimes also referred to as a "first layer") closer to the CNTs 130 than in a layer (sometimes also referred to as a "second layer") farther from the CNTs 130.

As noted above, ALD is used to engineer the stoichiometry of each atomic layer within the NDO. ALD $HfO_X$ can be deposited by alternating pulses of the precursor (Tetrakis (dimethylamido) hafnium(IV)) and $H_2O$ into a process chamber. The duration of the pulses, time/duration between pulses, as well as the ratio of the durations of Hf precursor: $H_2O$ pulses can change the amount and time the wafer is exposed to the Hf precursor, resulting in fine-grained control over the $HfO_X$ stoichiometry. Such timing and duration aspects are described in more detail with respect to FIG. 13 above. Moreover, ALD is an industry-standard capability, and $HfO_X$ dielectrics are already used in front-end-of-line silicon CMOS fabrication.

To demonstrate the ability to fine-tune the stoichiometry of the NDO, the pulse ratio of $Hf:H_2O$ is varied during $HfO_X$ deposition. FIGS. 2A-2E generally illustrate controlling hafnium oxide ($HfO_x$) stoichiometry for tunable doping. As shown in FIG. 2A, as the pulse ratio of $Hf:H_2O$ increases from 1:1, 2:1, 3:1, and 4:1, the bulk Hf concentration increases from 34.9% to 36.9% to 37.7% to 38.1% (measured by x-ray photoelectron spectroscopy, XPS). The ability to vary NDO stoichiometry results in the ability to fine-tune CNT doping, which in turn yields varying relative strengths of the p-type and n-type branches in CNFET current-voltage characteristics, as well as control of the threshold voltage. Each of the different NDO stoichiometries is deposited over back-gated CNFETs.

FIGS. 2B-2E illustrate how the slight increase in Hf concentration results in increasingly strong n-type doping of CNTs. As the Hf concentration increases, the strength of the n-type conduction branch increases, as evidenced by increasing drive current (average drive current ($I_{ON}$) of 1.8 µA, 4.5 µA, and 4.7 µA respectively), as well as a reduction in the p-type conduction branch. This manifests as an increasingly negative shift in the $V_T$ (average $V_T$ of 0.40 V, 0.22 V, and 0.12 V respectively). Moreover, this doping scheme is robust due to the high reproducibility and tight process control afforded by ALD: FIG. 4 shows how two different wafers with the same NDO result in statistically similar doping (average $V_T$ for the two wafers are 0.32 V and 0.35 V).

To drastically increase the amount of n-type doping and realize unipolar NMOS CNFETs, the first several atomic layers at the $HfO_X$-CNT interface can be engineered with significantly higher Hf concentration. This is one potential benefit of leveraging ALD, as the stoichiometry of each atomic layer can be independently controlled. The wafer is pre-treated with 50 repeated pulses of Hf precursor (without $H_2O$ pulses), followed by $HfO_X$ deposition.

FIGS. 3A-3F generally illustrate material and electrical characterization of CNFETs with engineered an Hf-rich $HfO_X$-CNT interface. As shown in FIGS. 3A-3D, XPS confirms that the first few atomic layers at the CNT-oxide interface reach >52% Hf, while the bulk has ~38% Hf. Electrical characterization of the back-gate CNFETs encapsulated with this NDO (e.g., 50 repeated pulses of Hf precursor) in FIGS. 3E, 3F show strongly unipolar NMOS CNFETs, increasing the n-type conduction branch by ~500× while decreasing the p-type conduction branch by >2,500× compared to the as-fabricated initial PMOS CNFETs (i.e., prior to NDO deposition).

While such a Hf-rich atomic layer is a strong reducer (resulting in the strong n-type doping), it is encapsulated in-situ within the low-pressure ALD chamber during the subsequent $HfO_X$ deposition and is thus air-stable. FIG. 6 shows CNFETs measured after 4, 12, and 30 days exposed to air; there is negligible change in the CNFET electrical characteristics. Moreover, FIG. 7 shows this nonstoichiometric oxide does not increase gate leakage.

Having demonstrated how NDO encapsulation enables tunable doping of CNTs, presented herein is an example method for quantifying the degree of n-type doping resulting from an NDO-encapsulated CNFET. Quantifying the amount of CNT doping can be useful for circuit design, as the amount of doping determines parameters such as $V_T$. To quantify the amount of CNT doping, an effective Schottky barrier height ($\Phi^*_{SB}$) between the CNT and the source/drain metal contacts (energy band diagram shown in FIG. 8C) is defined. Such an effective Schottky barrier height is employed as the p-type and n-type conduction in CNFETs is largely determined by the Schottky barrier height at the interface between the CNT and source/drain metal contacts. In the band diagram drawn in FIG. 8C, $\Phi^*_{SB}$ is the height of the potential barrier inhibiting electron transport from the source metal to semiconducting CNT channel. Higher values of $\Phi^*_{SB}$ result in a greater tunneling barrier for conduction electrons, reducing n-branch current. By calibrating the experimental $I_D$-$V_{GS}$ data to a Schottky barrier transport model, each fabricated CNFET can be calibrated to an associated value for $\Phi^*_{SB}$, determining a relationship between NDO stoichiometry and the $\Phi^*_{SB}$. The Landauer formulation was used to define the transport equations and the Wentzel-Kramer-Brillouin (WKB) approximation (see FIGS. 8A, 8B) was used to solve the tunneling probability across the Schottky barrier of height $\Phi^*_{SB}$. As shown in FIG. 8D, increasing the hafnium content in the NDO layer lowers $\Phi^*_{SB}$ from 0.3 eV to 0.15 eV, thereby bolstering n-type conduction in CNFETs. Therefore, analogous to how the degree of doping in silicon is quantified by the dopant concentration (interstitial dopants per $cm^3$), one can likewise quantify (and modulate) the degree of CNFET doping by tuning the NDO stoichiometry (by calculating the corresponding effective Schottky barrier height).

The degree of doping in the CNT channel can also be tuned by performing a gas anneal, using a mixture of 95% $N_2$ gas and 5% $H_2$ gas, on the NMOS CNFET after the channel has been encapsulated by the NDO layer. Forming a gas anneals reduces or eliminates trap states and dangling bonds in oxides and oxide-semiconductor interfaces by using Hydrogen to passivate these trap states at high temperatures (>250° C.). These trap states in the NDO are often electrically charged states and can electrostatically dope the carbon nanotubes in the NMOS CNFET. A forming gas anneal can be used to control the density of trap states existing in the NDO layer after ALD deposition, thereby enabling continuous tuning of the amount of electrostatic doping of the CNT channel by varying the forming gas anneal conditions. Increasing the temperature of the forming gas anneal can reduce the density of trap states in the NDO layer and alter the n-type conduction of NDO encapsulated CNFETs.

Symmetric CNFET CMOS Characterization

To achieve NMOS and PMOS CNFETs with similar $I_{ON}$, $I_{OFF}$, and $V_T$, previous works have relied on extremely low work function metals, such as scandium and erbium, to reduce the Schottky barrier for electron injection into the CNT channel. However, the high reactivity of these materials can preclude their integration into a silicon CMOS compatible fabrication process. Unfortunately, prior works attempting to use the lowest work function metals readily available in standard silicon CMOS processing, such as titanium, report significantly degraded n-type CNFET conduction, possibly because titanium's work function (4.33 eV) is lower than typical contact metals used for PMOS CNFETs, including palladium (5.22-5.64 eV), gold (5.31-5.47 eV), or platinum (5.12-5.93 eV), but still higher than scandium (3.5 eV), erbium (3.0 eV), etc.

NMOS CNFETs with NDO encapsulation and titanium contacts show symmetric performance as PMOS CNFETs fabricated with platinum contacts (a conventional source and drain metal for PMOS CNFETs). FIGS. 5A-5C generally illustrates combining NDO encapsulation with low work function contacts to achieve symmetric NMOS and PMOS CNFETs with similar $I_{ON}$, $I_{OFF}$, and $V_T$ magnitude. FIG. 5A shows the IV characteristics of a set of NMOS CNFETs with titanium contacts and a set of NMOS CNFETs with platinum contacts, all of which have been encapsulated with the same NDO. The NMOS CNFETS with titanium contacts achieve a 3× improvement in n-type conduction ON-current compared to NMOS CNFETs with platinum contacts (e.g., the average $I_{ON}$ increases by 3×). This enhanced n-type conduction allows fabrication of, in a silicon CMOS compatible fashion, PMOS and NMOS CNFETs with symmetric IV characteristics ($I_D$-$V_{GS}$ curves in FIGS. 5B, 5C).

In contrast to other doping methods, this combined doping technique neither degrades device characteristics nor introduces significant device variability. FIGS. 9A-9D illustrate various statistics for 20 NMOS and 20 PMOS CNFETs measured with $V_{DS}$=2 V (for NMOS) and $V_{DS}$=−2 V (for PMOS) and $V_{GS}$ swept from 2 V to −2 V for both NMOS and PMOS. These distributions for a set of NMOS and PMOS CNFETs demonstrate how device characteristics such as $I_{ON}$, $I_{ON}/I_{OFF}$, inverse sub-threshold slope, and |$V_T$| are unchanged after n-type doping. As seen in FIGS. 9A and 9B, both the NMOS and PMOS devices exhibit nearly identical drive current and $I_{ON}/I_{OFF}$ distributions (average $I_{ON}$ and $\log_{10}(I_{ON}/I_{OFF})$ differ by <6% and <2% respectively). FIGS. 9C and 9D show that the NMOS and PMOS CNFETs also exhibit similar inverse sub-threshold slope and threshold voltage distributions (quantified by the mean and standard deviation) while having a minimal effect on device-to-device variations. Whereas previously reported doping techniques that used unstable and air-reactive materials introduce large variations in IV characteristics, this combined doping technique avoids these variations by using air-stable materials ($HfO_2$ and Ti) that are already integrated within standard silicon-based fabrication processes.

CNFET CMOS Logic and Fabrication

As a demonstration, local back gate NMOS and PMOS CNFETs were integrated on the same substrate, and also demonstrated were static CMOS logic gates: inverters, 2-input "not-or" (NOR2), and 2-input "not-and" (NAND2) logic gates with rail-to-rail swing and high gain. FIG. 10C shows the voltage transfer curve of the fabricated CMOS inverter of FIGS. 10A and 10B. It achieved near-rail-to-rail swing (the output voltage swing is >99% of $V_{DD}$), with a maximum gain of >10 (FIGS. 10C and 10D). FIG. 11 shows fabricated two-input CMOS logic gates: CMOS NAND2 and CMOS NOR2 logic gates (circuit schematics in FIGS. 11A and 11E). FIGS. 11B-11D and 11F-11H show that both the NAND2 and NOR2 gates achieved near-rail-to-rail swing (the output voltage swing is >99% of $V_{DD}$), with maximum gains of >11 and >15, respectively. These logic gates were measured at a scaled supply voltage of 1.2 $V_{DD}$, without any external biasing.

Here, local metal back gates were defined on top of an 800 nm $SiO_2$ wafer using photolithography. The rest of the fabrication up through CNT deposition follows the above. After CNT deposition, 1 nm titanium and 40 nm platinum were deposited for the PMOS source and drain electrodes and 40 nm titanium was deposited for the NMOS source and drain electrodes by electron-beam evaporation followed by lift-off. CNTs outside the channel were selectively removed using an oxygen plasma etch. 40 nm $SiO_2$ was then deposited over the PMOS CNFETs using electron-beam evaporation to protect the CNTs from the subsequent NDO deposition, while the NMOS CNFETs were left exposed. To dope the NMOS CNFETS, 20 nm of NDO was deposited over the substrate, followed by removing the NDO above the PMOS CNFETs using a chlorine reactive ion etch (the PMOS CNFETs are protected during this etch by the previously deposited $SiO_2$). Final metal routing was then be patterned and defined.

FIG. 15 captures this approach in more general terms as a method 1500 for fabricating a CMOS CNFET, and is explained with reference to the CMOS CNFET 1000 of FIG. 10A. At step 1510, two channels of CNTs (e.g., the CNTs 1070 in the channel 1060 and the CNTs 1030 in the channel 1020) are deposited on the substrate 1095, including over the interleaving components 1090 (substrate) and 1085 (a gate dielectric layer).

At step 1520, the PMOS CNFET 1005b is generated by forming the source electrode 1050a and the drain electrode 1050b. Both electrodes 1050a, 1050b can be composed of platinum and in electrical contact with the channel 1060. At step 1530, the NMOS CNFET 1005a is generated by forming the source electrode 1010a and the drain electrode 1010b. Both electrodes 1010a and 1010b can be composed of titanium and in electrical contact with the second channel. Steps 1520 and 1530 can be reversed in order, performed substantially in parallel, and/or in an overlapping manner.

At step 1540, the layer 1080 of insulating material (e.g., silicon dioxide) is deposited over the PMOS CNFET 1005b to protect its channel 1060 of CNTs 1070 from doping. At step 1550, a nonstoichiometric oxide layer is deposited over the second channel 1020 via atomic layer deposition. At step 1560, any nonstoichiometric oxide deposited on the layer of insulating material over the PMOS CNFET 1005b is removed via etching, resulting in the formation of the NDO layer 1040.

The term "ON-current" as used herein with respect to a NMOS CNFET or a PMOS CNFET refers to the current flowing into that CNFET when the CNFET is in an ON state. The term "OFF-current" as used herein with respect to a NMOS CNFET or a PMOS CNFET refers to the current flowing into that CNFET when the CNFET is in an OFF state, and is sometimes also referred to as a "leakage current". The term "threshold voltage" as used herein with respect to a NMOS CNFET or a PMOS CNFET can generally characterize the minimum $V_{GS}$ voltage value that establishes conduction between the source and drain electrodes of that CNFET.

The source and drain electrodes 1010a, 1010b, while disclosed as being made of titanium can be formed of any suitable conductor having a work function of less than about 5 eV. The NDO layer 1040 can be disposed within about 10 nm of the channel and have a stoichiometry based on the work function of the electrodes 1010a, 1010b, i.e., to achieve symmetric performance between the PMOS CNFET 1005b and the NMOS CNFET 1005a. As a result, the PMOS CNFET 1005b can have an ON-current, an OFF-current, and/or a threshold voltage with a magnitude approximately equal, or up to within about 6%-50%, of those of the NMOS CNFET 1005a.

More generally, the CMOS CNFET 1000 is illustrative of a PMOS CNFET that has a) source and drain contacts of a first metal (e.g., platinum), and b) a dielectric layer (e.g., $SiO_2$), while the PMOS CNFET has a) source and drain contacts of a different metal (e.g., titanium), as well as b) another dielectric layer which is a different material (e.g., an NDO) than the dielectric layer of the PMOS CNFET.

Global Back Gate CNFET Fabrication

For global back gate CNFETs, a highly p-doped silicon substrate was used as the back gate for all CNFETs. 15 nm of $HfO_X$ was deposited using ALD for the gate dielectric. The local back-gate CNFETs (PMOS or NMOS) were fabricated with the same gate stack: platinum metal for the back-gate followed by 15 nm of $HfO_X$ as the gate dielectric. The wafer was then immersed in >99.9% semiconducting CNT solution (modified Nanointegris IsoSol-S100) for 48 hours. The average CNT density is about 15 CNTs/μm. CNT density is typically determined by imaging an array or network of CNTs, then drawing a 1 μm line and counting how many CNTs cross that line. The channel length of the CNFETs was smaller than the average length of the CNTs. So the CNFETs were comprised of both direct transport from CNTs bridging the entire channel as well as percolation transport from network-based CNTs. Lithography was used to define the source and drain electrodes (channel length ~2.5 μm and channel width=20 μm, doping results are similar with channel length=1 μm). Titanium and/or platinum were then deposited using electron-beam evaporation followed by lift-off. To dope the NMOS CNFETS, 20 nm of NDO is deposited using ALD. A chlorine reactive ion etch removes the NDO covering the probing pads.

XPS Material Characterization

The X-Ray photoelectron spectroscopy data of FIG. 3A was obtained using a PHI VersaProbe II XPS. The $Hf^{4f}$ and $O^{1s}$ spectra were measured for ALD-deposited NDO films. Measurements of hafnium and oxygen content in bulk NDO films were made by obtaining $Hf^{4f}$ and $O^{1s}$ spectra after using 6 minutes of Ar (argon) sputtering (~5 Å/min) to remove the first 3 nm from the NDO surface. A depth profile of NDO films was obtained by measuring the $Hf^{4f}$ and $O^{1s}$ spectra after each minute of Ar sputtering (40 minutes total).

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

"Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A carbon nanotube field effect transistor (CNFET), comprising:
    a source electrode;
    a drain electrode; and
    a channel formed between the source electrode and the drain electrode, including:
        one or more carbon nanotubes (CNTs); and
        a plurality of layers deposited on the one or more CNTs, each layer including a nonstoichiometric oxide,
        wherein the plurality of layers includes a first layer formed between the one or more CNTs and a second layer, and wherein a concentration of the nonstoichiometric oxide in the first layer is different than a concentration of the nonstoichiometric oxide in the second layer.

2. The CNFET of claim 1, wherein the nonstoichiometric oxide includes hafnium oxide (HfOx).

3. The CNFET of claim 1, wherein a thickness of the plurality of layers is from about 4 nm to about 50 nm.

4. The CNFET of claim 1, wherein at least one of the source electrode and the drain electrode is composed of titanium.

5. The CNFET of claim 4, wherein the CNFET is an n-type metal-oxide semiconductor (NMOS) CNFET.

6. An integrated circuit comprising:
    the NMOS CNFET of claim 5; and
    a p-type metal-oxide semiconductor (PMOS) CNFET,
    wherein a magnitude of an ON-current for the NMOS CNFET is within from about 6% to about 50% of a magnitude of an ON-current for the PMOS CNFET.

7. An integrated circuit comprising the CNFET of claim 1.

8. The CNFET of claim 1, wherein the concentration of the nonstoichiometric oxide in the first layer and the concentration of the nonstoichiometric oxide in the second layer are based on a desired Schottky barrier height of the CNFET.

9. The CNFET of claim 1, wherein the concentration of the nonstoichiometric oxide in the first layer and the concentration of the nonstoichiometric oxide in the second layer are selected based on a desired threshold voltage of the CNFET.

10. A process of making a carbon nanotube field effect transistor (CNFET), the process comprising:
    forming a channel of carbon nanotubes (CNTs); and
    depositing a nonstoichiometric doping oxide (NDO) layer on the channel,
    wherein depositing the NDO layer comprises varying a stoichiometry of the NDO layer while depositing the NDO layer.

11. The process of claim 10, wherein depositing the NDO layer comprises atomic layer deposition of the NDO.

12. The process of claim 10, wherein varying the stoichiometry of the NDO layer comprises:
    varying a ratio of a number of hafnium precursor pulses per $H_2O$ pulses used during the deposition of the NDO layer.

13. The process of claim 10, wherein varying the stoichiometry of the NDO layer comprises:
    pretreating the channel of CNTs with Hafnia precursor pulses prior to depositing the NDO layer.

14. The process of claim 10, wherein varying the stoichiometry of the NDO layer comprises:
    varying a duration of pretreatment of the channel of CNTs with Hafnia precursor pulses prior to depositing the NDO layer.

15. The process of claim 10, further comprising:
    selecting the stoichiometry of the NDO layer based on a desired threshold voltage of the CNFET.

16. The process of claim 10, further comprising:
    selecting the stoichiometry of the NDO layer based on a Schottky barrier height of the CNFET.

17. The process of claim 10, further comprising, before depositing the NDO layer:
    depositing an oxide layer on the channel.

18. The process of claim 10, further comprising:
    annealing the NDO layer in a forming gas mixture of $N_2$ and $H_2$.

19. A method of fabricating a complementary metal-oxide semiconductor carbon nanotube field effect transistor (CMOS CNFET), the method comprising:
    depositing, on a substrate, a first channel of carbon nanotubes (CNTs) and a second channel of CNTs;
    forming, in electrical contact with the first channel, a source electrode composed of platinum and a drain electrode composed of platinum to generate a p-type metal-oxide semiconductor (PMOS) CNFET;
    forming, in electrical contact with the second channel, a source electrode composed of titanium and a drain electrode composed of titanium to generate an n-type metal-oxide semiconductor (NMOS) CNFET;
    depositing, over the PMOS CNFET, a layer of an insulating material;
    depositing, via atomic layer deposition (ALD), nonstoichiometric oxide layers over the second channel; and
    removing, via etching, nonstoichiometric oxide deposited on the layer of insulating material over the PMOS CNFET, wherein depositing the nonstoichiometric oxide layers comprises independently controlling a stoichiometry of each of the nonstoichiometric oxide layers,
wherein the nonstoichiometric oxide layers include a first nonstoichiometric oxide layer and a second nonstoichiometric oxide layer, and wherein a concentration of the nonstoichiometric oxide in the first nonstoichiometric oxide layer is different than a concentration of the nonstoichiometric oxide in the second nonstoichiometric oxide layer.

* * * * *